United States Patent
Yamazaki et al.

(10) Patent No.: US 9,029,184 B2
(45) Date of Patent: May 12, 2015

(54) PHOTOELECTRIC CONVERSION DEVICE AND METHOD FOR MANUFACTURING THE SAME

(75) Inventors: Shunpei Yamazaki, Setagaya (JP); Akihisa Shimomura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1203 days.

(21) Appl. No.: 12/405,465

(22) Filed: Mar. 17, 2009

(65) Prior Publication Data

US 2009/0242032 A1    Oct. 1, 2009

(30) Foreign Application Priority Data

Mar. 28, 2008  (JP) ................... 2008-086313

(51) Int. Cl.
*H01L 31/18*   (2006.01)
*H01L 31/0392* (2006.01)
(Continued)

(52) U.S. Cl.
CPC ........ *H01L 31/03921* (2013.01); *H01L 31/182* (2013.01); *H01L 31/1896* (2013.01); *H01L 31/18* (2013.01); *H01L 31/1804* (2013.01); *H01L 31/022425* (2013.01); *H01L 31/0236* (2013.01); *H01L 31/068* (2013.01); *H01L 31/0687* (2013.01); *H01L 31/072* (2013.01); *H01L 31/0725* (2013.01); *H01L 31/075* (2013.01); *H01L 31/076* (2013.01); *Y02E 10/544* (2013.01); *Y02E 10/548* (2013.01); *Y02E 10/547* (2013.01)

(58) Field of Classification Search
CPC ... H01L 31/0392; H01L 31/18; H01L 31/068; H01L 31/1804; H01L 31/1896; H01L 31/182; Y02E 10/547
USPC ........ 136/261; 438/68, 485, 459, 520, 57, 98; 257/E21.599
See application file for complete search history.

(56) References Cited

U.S. PATENT DOCUMENTS

| 4,496,788 A | 1/1985 | Hamakawa et al. |
| 4,926,229 A | 5/1990 | Nakagawa et al. |

(Continued)

FOREIGN PATENT DOCUMENTS

| EP | 0797258 A | 9/1997 |
| EP | 0849788 A | 6/1998 |

(Continued)

*Primary Examiner* — Matthew Martin
(74) *Attorney, Agent, or Firm* — Eric J. Robinson; Robinson Intellectual Property Law Office, P.C.

(57) ABSTRACT

To provide a resource-saving photoelectric conversion device with excellent photoelectric conversion characteristics. Thin part of a single crystal semiconductor substrate, typically a single crystal silicon substrate, is detached to structure a photoelectric conversion device using a thin single crystal semiconductor layer, which is the detached thin part of the single crystal semiconductor substrate. The thin part of the single crystal semiconductor substrate is detached by a method in which a substrate is irradiated with ions accelerated by voltage, or a method in which a substrate is irradiated with a laser beam which makes multiphoton absorption occur. A so-called tandem-type photoelectric conversion device is obtained by stacking a unit cell including a non-single-crystal semiconductor layer over the detached thin part of the single crystal semiconductor substrate.

12 Claims, 19 Drawing Sheets

(51) Int. Cl.
*H01L 31/0224* (2006.01)
*H01L 31/0236* (2006.01)
*H01L 31/068* (2012.01)
*H01L 31/0687* (2012.01)
*H01L 31/072* (2012.01)
*H01L 31/0725* (2012.01)
*H01L 31/075* (2012.01)
*H01L 31/076* (2012.01)
*H01L 31/00* (2006.01)

(56) References Cited

U.S. PATENT DOCUMENTS

| | | | |
|---|---|---|---|
| 4,959,106 | A | 9/1990 | Nakagawa et al. |
| 5,002,617 | A | 3/1991 | Kanai et al. |
| 5,002,618 | A | 3/1991 | Kanai et al. |
| 5,006,180 | A | 4/1991 | Kanai et al. |
| 5,024,706 | A | 6/1991 | Kanai et al. |
| 5,417,770 | A | 5/1995 | Saitoh et al. |
| 5,439,533 | A | 8/1995 | Saito et al. |
| 5,527,396 | A | 6/1996 | Saitoh et al. |
| 5,571,749 | A | 11/1996 | Matsuda et al. |
| 5,635,408 | A | 6/1997 | Sano et al. |
| 5,665,607 | A | 9/1997 | Kawama et al. |
| 5,676,765 | A | 10/1997 | Saito et al. |
| 5,736,431 | A | 4/1998 | Shinohara et al. |
| 5,811,348 | A | 9/1998 | Matsushita et al. |
| 6,100,166 | A | 8/2000 | Sakaguchi et al. |
| 6,100,465 | A | 8/2000 | Shinohara et al. |
| 6,107,213 | A | 8/2000 | Tayanaka |
| 6,190,937 | B1 | 2/2001 | Nakagawa et al. |
| 6,194,239 | B1 | 2/2001 | Tayanaka |
| 6,194,245 | B1 | 2/2001 | Tayanaka |
| 6,326,280 | B1 | 12/2001 | Tayanaka |
| 6,426,274 | B1 | 7/2002 | Tayanaka |
| 6,534,382 | B1 | 3/2003 | Sakaguchi et al. |
| 6,566,277 | B1 | 5/2003 | Nakagawa et al. |
| 6,692,981 | B2 | 2/2004 | Takato et al. |
| 6,756,289 | B1 | 6/2004 | Nakagawa et al. |
| 6,818,529 | B2 | 11/2004 | Bachrach et al. |
| RE42,830 | E | 10/2011 | Matsushita et al. |
| 2003/0203547 | A1 | 10/2003 | Sakaguchi et al. |
| 2005/0022864 | A1 | 2/2005 | Fujioka et al. |
| 2005/0121070 | A1* | 6/2005 | Fujisawa et al. ............... 136/256 |
| 2005/0145972 | A1 | 7/2005 | Fukuda et al. |
| 2006/0112986 | A1* | 6/2006 | Atwater et al. ............... 136/255 |
| 2007/0193622 | A1 | 8/2007 | Sai |
| 2008/0160661 | A1* | 7/2008 | Henley ............... 438/68 |
| 2008/0179547 | A1* | 7/2008 | Henley ............... 250/492.21 |
| 2010/0224241 | A1 | 9/2010 | Fukui |

FOREIGN PATENT DOCUMENTS

| | | |
|---|---|---|
| EP | 1 088 913 | 4/2001 |
| EP | 1478030 A | 11/2004 |
| EP | 1906455 A | 4/2008 |
| JP | 62-042467 A | 2/1987 |
| JP | 01-227307 | 9/1989 |
| JP | 06-044638 | 6/1994 |
| JP | 07-226528 | 8/1995 |
| JP | 08-213645 A | 8/1996 |
| JP | 10-093122 | 4/1998 |
| JP | 10-093122 A | 4/1998 |
| JP | 10-233352 A | 9/1998 |
| JP | 10-335683 | 12/1998 |
| JP | 10-335683 A | 12/1998 |
| JP | 11-040832 | 2/1999 |
| JP | 2000-150940 | 5/2000 |
| JP | 2000-294754 | 10/2000 |
| JP | 2001-068709 | 3/2001 |
| JP | 2001-077044 | 3/2001 |
| JP | 2001-077044 A | 3/2001 |
| JP | 2001-160540 | 6/2001 |
| JP | 2002-100789 | 4/2002 |
| JP | 2002-348198 | 12/2002 |
| JP | 2003-017723 | 1/2003 |
| JP | 2003-017723 A | 1/2003 |
| JP | 2003-324188 | 11/2003 |
| JP | 2003-347572 A | 12/2003 |
| JP | 2004-014958 | 1/2004 |
| JP | 2004-087667 | 3/2004 |
| JP | 2005-050905 | 2/2005 |
| JP | 2005-268682 | 9/2005 |
| JP | 2005-277136 A | 10/2005 |
| JP | 2006-041430 | 2/2006 |
| WO | WO-2006/137322 | 12/2006 |

\* cited by examiner 1004  1010  1014  1016 1018 1020

1024

1002

PHOTOELECTRIC CONVERSION DEVICE AND METHOD FOR MANUFACTURING THE SAME

BACKGROUND OF THE INVENTION

1. Field of the Invention

The present invention relates to a photoelectric conversion device using a single crystal semiconductor or a polycrystalline semiconductor and to a method for manufacturing the photoelectric conversion device.

2. Description of the Related Art

Since the situation of global warming has been serious, a measure against the global warming is an issue that needs to be addressed worldwide. Most greenhouse effect gases which are regarded as a main cause for global-warming, such as carbon dioxide, are exhausted by consumption of energy, such as oil, coals, and natural gases. However, such energy is indispensable to the industrial society. Therefore, the amount of energy consumption cannot be reduced simply. Thus, solar-electric power generation which discharges less amount of carbon dioxide and which is eco-friendly has attracted attentions as the next-generation energy.

For the solar-electric power generation, a silicon photoelectric conversion device, which converts light energy into electric energy utilizing semiconductor characteristics, is widely applied. Since silicon photoelectric conversion devices typified by solar cells are already available in the market and government around the world support solar cells, the production thereof has been expanding year by year. For example, the production of solar cells around the world in 2006 is 2521 MW, which has increased by over 40% per annum.

However, there are many obstacles to the widespread of solar-electric power generation. One of the obstacles is a higher cost of solar-electric power generation compared with a cost of conventional commercial power. In order to reduce a cost for photoelectric power generation, improvement of efficiency in a solar cell, reduction of costs such as manufacturing costs, and the like are indispensable.

Further, the present obstacle to the widespread of solar-electric power generation is short supply of silicon. The supply-demand balance of silicon had been excess in supply reflecting semiconductor recession. In contrast, silicon is now short of supply since around fiscal 2005 because of drastic growth of the solar cell market with the recovery of the semiconductor (LSI) industry. Though major silicon suppliers in the world have already tried to increase capability of silicon production, the increase in demand outweighs the capability.

While shortage of silicon materials is obvious, a thin film silicon photoelectric conversion device has attracted attentions. In the thin film silicon photoelectric conversion device, a thin silicon film is formed over a supporting substrate and the thin silicon film functions as a photoelectric conversion layer. In contrast, a bulk silicon photoelectric conversion device, which is mainly used currently, includes a main portion formed from a single crystal silicon substrate or a polycrystalline silicon substrate having a thickness which is more than several tens times or more as large as a thickness necessary for the photoelectric conversion layer. Therefore, it is hard to say that silicon is used effectively in the bulk silicon photoelectric conversion device. Speaking of extremes, most part of the single crystal silicon substrate or the polycrystalline silicon substrate which is used for the bulk silicon photoelectric conversion device functions only as a structural body for keeping the shape of the photoelectric conversion device. The thin film silicon photoelectric conversion device can have a structure in which silicon is used only for a region for converting light into electricity. Therefore, a silicon usage can be reduced drastically compared with a silicon usage of the bulk silicon photoelectric conversion device.

However, a thin film silicon photoelectric conversion device has lower photoelectric conversion efficiency as compared to a bulk silicon photoelectric conversion device because, generally in a thin film silicon photoelectric conversion device, a thin silicon film is formed over a supporting substrate by utilizing a variety of chemical or physical vapor deposition methods. Therefore, a method for manufacturing a solar cell is proposed in which hydrogen ions are implanted into a crystalline semiconductor and the crystalline semiconductor is cut by heat treatment to obtain a crystalline semiconductor layer (for example, see Patent Document 1: Japanese Published Patent Application No. H10-335683). After a crystalline semiconductor in which ions of a predetermined element are implanted in a layered manner is attached to a surface of electrode-forming paste applied over a substrate provided with an insulating layer, heat treatment is performed at 300° C. to 500° C. to bond the crystalline semiconductor to an electrode. Next, by heat treatment at 500° C. to 700° C., voids distributed in a layered manner are formed in a region of the predetermined element implanted into the crystalline semiconductor, and further, the crystalline semiconductor is divided at the voids by heat distortion. Accordingly, a crystalline semiconductor layer over the electrode is obtained. Furthermore, an amorphous silicon layer is formed over the crystalline semiconductor layer. Thus, a tandem-type solar cell is manufactured. In this method, a single crystal silicon solar battery cell to be a first power generation layer is formed.

SUMMARY OF THE INVENTION

If a single crystal silicon substrate can be used as a crystalline semiconductor and a single crystal silicon layer can be obtained over an electrode, high efficiency can be expected. However, in a method like Patent Document 1 in which a single crystal silicon substrate is bonded to another substrate with electrode-forming paste as an adhesive, the degree of adhesion in an adhering portion or the change in property (the reduction in bonding strength) of the electrode-forming paste serving as an adhesive becomes a problem. Accordingly, there is a concern about reliability of a solar cell to be completed. Further, bonding to another substrate may cause increase in the number and complexity of manufacturing steps or limitation on a process temperature due to a property of a material for the substrate to be bonded. Therefore, even if high efficiency is achieved, problems such as increase in cost, reduction in productivity, and unsuitability for mass production due to increase in complexity of manufacturing steps or the like still remain. Consequently, there is a concern that power generated by a photoelectric conversion device having such problems cannot compete with a conventional commercial power.

In view of the foregoing problems, it is an object of the present invention to provide a method for manufacturing a photoelectric conversion device with excellent photoelectric conversion characteristics through a simple process. Further, it is another object of the present invention to provide a resource-saving photoelectric conversion device in which a resource such as a semiconductor material is effectively utilized and to provide a method for manufacturing the photoelectric conversion device. Furthermore, it is another object of the present invention to provide a photoelectric conversion device typified by a solar cell with an excellent photoelectric conversion characteristic and to provide a method for manufacturing the photoelectric conversion device.

A main point of the present invention is that thin part of a single crystal semiconductor substrate, typically a single crystal silicon substrate, is detached to structure a photoelectric conversion device using a thin single crystal semiconductor layer, which is the detached thin part of the single crystal semiconductor substrate. It is preferable to provide a stack-type photoelectric conversion device by forming an impurity semiconductor layer and a non-single-crystal semiconductor layer which are formed using an n-type semiconductor or a p-type semiconductor over a thin single crystal semiconductor layer. Between a pair of electrodes, a structure is interposed in which a unit cell having a non-single-crystal semiconductor layer is stacked over a unit cell having a single crystal semiconductor layer.

The thickness of the detached thin part of the single crystal semiconductor substrate is greater than or equal to 1 μm and less than or equal to 10 μm, preferably greater than or equal to 3 μm and less than or equal to 5 μm. It is preferable that thin part of a single crystal semiconductor substrate be detached by a method in which the single crystal semiconductor substrate is irradiated with ions (typically hydrogen ions) accelerated by voltage by an ion implantation method to divide the single crystal semiconductor substrate by heat treatment or a method in which the single crystal semiconductor substrate is irradiated with a laser beam which makes multiphoton absorption occur to divide the single crystal semiconductor substrate.

Further, it is preferable that the impurity semiconductor layer and the non-single-crystal semiconductor layer which are formed using an n-type semiconductor or a p-type semiconductor over the detached thin part of the single crystal semiconductor substrate be formed by a chemical vapor deposition (CVD) method, typically a plasma CVD method. Preferably, a p-type impurity semiconductor layer, an n-type impurity semiconductor layer, a non-single-crystal semiconductor layer, and a p-type impurity semiconductor layer are sequentially stacked over detached thin part of a single crystal semiconductor substrate including an n-type semiconductor region. Alternatively, an n-type impurity semiconductor layer, a p-type impurity semiconductor layer, a non-single-crystal semiconductor layer, and an n-type impurity semiconductor layer are sequentially stacked over detached thin part of a single crystal semiconductor substrate including a p-type semiconductor region.

It is to be noted that "non-single-crystal semiconductor" in this specification is an intrinsic or substantially intrinsic semiconductor other than a single crystal semiconductor, and refers to a semiconductor which has an impurity imparting p-type conductivity or n-type conductivity at a concentration of $1 \times 10^{20}$ cm$^{-3}$ or less and oxygen and nitrogen each at a concentration of $9 \times 10^{19}$ cm$^{-3}$ or less and which has photoconductivity of 100 times or more the dark conductivity. A non-single-crystal semiconductor may contain boron at 1 ppm to 1000 ppm. That is, there is a case where a non-single-crystal semiconductor has weak n-type conductivity when an impurity element for controlling valence electrons is not added intentionally; in that case, an impurity element imparting p-type conductivity may be added concurrently with film formation or after film formation. Such a semiconductor is also referred to as a non-single-crystal semiconductor. An impurity element imparting p-type conductivity is typically boron, and the concentration of p-type impurity included in a non-single-crystal semiconductor is approximately $1 \times 10^{14}$ cm$^{-3}$ to $6 \times 10^{16}$ cm$^{-3}$.

The present invention can also be applied to a polycrystalline semiconductor substrate, typically, a polycrystalline silicon substrate. In the case of using a polycrystalline semiconductor substrate, a photoelectric conversion device is structured using a thin polycrystalline semiconductor layer, which is detached thin part of a polycrystalline semiconductor substrate.

The term "single crystal" in this specification refers to a crystal in which crystal faces are aligned and crystal axes are aligned, and atoms or molecules which are included in the single crystal are aligned in a spatially ordered manner. Although single crystals are structured by orderly aligned atoms, single crystals may include a lattice defect in which the alignment is disordered in a part or single crystals may include intended or unintended lattice strain.

One embodiment of the present invention is that an embrittled layer is formed in a single crystal semiconductor substrate and an impurity element imparting one conductivity type is introduced into the one surface side of the single crystal semiconductor substrate to form a first impurity semiconductor layer. In addition, a thin single crystal semiconductor layer provided with the first impurity semiconductor layer is separated from the single crystal semiconductor substrate by dividing the single crystal semiconductor substrate at the embrittled layer, a second impurity semiconductor layer is formed over a surface of the thin single crystal semiconductor layer on the side opposite to the first impurity semiconductor layer, a third impurity semiconductor layer, a non-single-crystal semiconductor layer, and a fourth impurity semiconductor layer are sequentially formed over the second impurity semiconductor layer, a first electrode is formed over the fourth impurity semiconductor layer, and a second electrode is formed over a surface of the thin single crystal semiconductor layer on the side opposite to the second impurity semiconductor layer.

Another embodiment of the present invention is that an insulating layer is formed over at least one surface of a single crystal semiconductor substrate, an embrittled layer is formed in the single crystal semiconductor substrate, and an impurity element imparting one conductivity type is introduced into the one surface side of the single crystal semiconductor substrate to form a first impurity semiconductor layer. In the photoelectric conversion device, a thin single crystal semiconductor layer which is provided with the first impurity semiconductor layer and is in contact with the insulating layer is separated from the single crystal semiconductor substrate by dividing the single crystal semiconductor substrate at the embrittled layer, a second impurity semiconductor layer is formed over a surface of the thin single crystal semiconductor layer on the side opposite to the first impurity semiconductor layer, a third impurity semiconductor layer, a non-single-crystal semiconductor layer, and a fourth impurity semiconductor layer are sequentially formed over the second impurity semiconductor layer, a first electrode is formed over the fourth impurity semiconductor layer, the insulating layer which is located on the side opposite to the first electrode and is in contact with the thin single crystal semiconductor layer is selectively removed to expose the thin single crystal semiconductor layer, and a second electrode is formed in contact with the exposed thin single crystal semiconductor layer.

In the above structure, the thin single crystal semiconductor layer preferably has a thickness of greater than or equal to 1 μm and less than or equal to 10 μm.

Further, the embrittled layer is preferably formed by irradiation with ions accelerated by voltage from the one surface side of the single crystal semiconductor substrate by an ion implantation method with mass separation, or by concentrating a laser beam which makes multiphoton absorption occur into the single crystal semiconductor substrate and scanning the single crystal semiconductor substrate by the laser beam.

In the above structure, the second impurity semiconductor layer, the third impurity semiconductor layer, the non-single-crystal semiconductor layer, and the fourth impurity semiconductor layer can be formed by a plasma CVD method. Further, as the second impurity semiconductor layer, the third impurity semiconductor layer, and the fourth impurity semiconductor layer, a microcrystalline semiconductor layer including an impurity element imparting n-type conductivity or a microcrystalline semiconductor layer including an impurity element imparting p-type conductivity is preferably formed. As the non-single-crystal semiconductor layer, an amorphous semiconductor layer or a microcrystalline semiconductor layer is preferably formed.

Another embodiment of the present invention is a photoelectric conversion device including a stacked structure in which over a thin single crystal semiconductor layer provided with a first impurity semiconductor layer including an impurity element imparting one conductivity type, a second impurity semiconductor layer including an impurity element imparting one conductivity type opposite to that of the first impurity semiconductor layer, a third impurity semiconductor layer including an impurity element imparting one conductivity type opposite to that of the second impurity semiconductor layer; a non-single-crystal semiconductor layer, and a fourth impurity semiconductor layer including an impurity element imparting one conductivity type opposite to that of the third impurity semiconductor layer are sequentially stacked. In the photoelectric conversion device, a pair of electrodes sandwiches the stacked structure.

Another embodiment of the present invention is a photoelectric conversion device including a first electrode; a thin single crystal semiconductor layer including a first impurity semiconductor layer having an impurity element imparting one conductivity type which is provided on a first electrode side; a second impurity semiconductor layer which includes an impurity element imparting one conductivity type opposite to that of the first impurity semiconductor layer and is provided over a surface of the thin single crystal semiconductor layer on the side opposite to the first electrode; a third impurity semiconductor layer which includes an impurity element imparting one conductivity type opposite to that of the second impurity semiconductor layer and is provided over the second impurity semiconductor layer; a non-single-crystal semiconductor layer provided over the third impurity semiconductor layer; a fourth impurity semiconductor layer which includes an impurity element imparting one conductivity type opposite to that of the third impurity semiconductor layer and is provided over the non-single-crystal semiconductor layer; and a second electrode provided over the fourth impurity semiconductor layer.

Another embodiment of the present invention is a photoelectric conversion device including a first unit cell including a single crystal semiconductor layer; a second unit cell which includes a non-single-crystal semiconductor layer and is stacked over the first unit cell; a first electrode provided over a surface of the first unit cell on the side opposite to the second unit cell; and a second electrode provided over a surface of the second unit cell on the side opposite to the first unit cell. In the photoelectric conversion device, the first unit cell includes a stacked structure of a thin single crystal semiconductor layer provided with a first impurity semiconductor layer including an impurity element imparting one conductivity type and a second impurity semiconductor layer including an impurity element imparting one conductivity type opposite to that of the first impurity semiconductor layer, and the second unit cell includes a stacked structure of a third impurity semiconductor layer including an impurity element imparting one conductivity type opposite to that of the second impurity semiconductor layer, the non-single-crystal semiconductor layer, and a fourth impurity semiconductor layer including an impurity element imparting one conductivity type opposite to that of the third impurity semiconductor layer.

In the above structure, it is preferable that the first unit cell include a p-n structure, that the second unit cell include a p-i-n structure, and that a p-n junction be formed at a junction between the first unit cell and the second unit cell.

Another embodiment of the present invention is a photoelectric conversion device including a bottom cell having a single crystal semiconductor layer, a top cell having a non-single-crystal semiconductor layer; a back surface electrode in contact with the bottom cell, and a light-receiving surface electrode in contact with the top cell. In the photoelectric conversion device, the bottom cell includes a stacked structure of a thin single crystal semiconductor layer provided with a first impurity semiconductor layer including an impurity element imparting one conductivity type on a side in contact with the back surface electrode and a second impurity semiconductor layer including an impurity element imparting one conductivity type opposite to that of the first impurity semiconductor layer over a surface of the thin single crystal semiconductor layer on the side opposite to the first impurity semiconductor layer. Further, in the photoelectric conversion device, the top cell includes a stacked structure of a third impurity semiconductor layer which is in contact with the second impurity semiconductor layer and has an impurity element imparting one conductivity type opposite to that of the second impurity semiconductor layer, the non-single-crystal semiconductor layer in contact with the third impurity semiconductor layer, and a fourth impurity semiconductor layer which is in contact with the non-single-crystal semiconductor layer and has an impurity element imparting one conductivity type opposite to that of the third impurity semiconductor layer.

In the above structure, the bottom cell preferably includes a p-n structure, the top cell preferably includes a p-i-n structure, and a p-n junction is preferably formed at a junction between the bottom cell and the top cell.

Further, the thin single crystal semiconductor layer preferably has a thickness of greater than or equal to 1 μm and less than or equal to 10 μm.

Furthermore, a side surface of the thin single crystal semiconductor layer is preferably covered with the second impurity semiconductor layer, the third impurity semiconductor layer, the non-single-crystal semiconductor layer, the fourth impurity semiconductor layer, and the second electrode in this order, and an insulating layer is preferably placed between the first electrode and the second impurity semiconductor layer with which the side surface of the thin single crystal semiconductor layer is covered.

Note that the term "embrittled layer" in this specification refers to a region at which a single crystal semiconductor substrate is divided into a thin single crystal semiconductor layer and a substrate to be reused (a single crystal semiconductor substrate) in a division step, and its vicinity. The states of the "embrittled layer" vary according to a means for forming the "embrittled layer". For example, the "embrittled layer" indicates a region which is embrittled by locally distorting its crystal structure. Note that a region from the surface side of the single crystal semiconductor substrate to the "embrittled layer" is somewhat embrittled depending on a case. However, the "embrittled layer" in this specification refers to a region at which division is performed later and its vicinity.

Note that in this specification, a numeral such as "first", "second", "third", or "fourth" which are included in a term is given for convenience in order to distinguish elements, does not limit the number and does not limit the arrangement and the order of the steps.

A photoelectric conversion device is manufactured using detached thin part of a single crystal semiconductor substrate; accordingly, the amount of a single crystal semiconductor material used can be reduced more than before, and thus, a resource-saving photoelectric conversion device can be provided. The rest of the single crystal semiconductor substrate from which thin part of a single crystal semiconductor substrate as a raw material has been detached can be repeatedly reused, and thus, a resource can be effectively utilized.

Further, by forming a stack-type photoelectric conversion device in which a unit cell having a non-single-crystal semiconductor layer is stacked over a unit cell having detached thin part of a single crystal semiconductor substrate, a photoelectric conversion device with an excellent photoelectric conversion characteristic can be provided. Furthermore, when a semiconductor layer including a non-single-crystal semiconductor layer is formed over a detached thin single crystal semiconductor layer by a chemical vapor deposition method, typically a plasma CVD method to manufacture a stack-type photoelectric conversion device, a photoelectric conversion device with an excellent photoelectric conversion characteristic can be manufactured through a simple process.

DETAILED DESCRIPTION OF THE INVENTION

Embodiment

Embodiments of the present invention will be described below with reference to the accompanying drawings. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of the embodiments given below.

Embodiment 1

In this embodiment, a method for manufacturing a photoelectric conversion device and a structure of the manufactured photoelectric conversion device, are described with reference to drawings. In the photoelectric conversion device in this embodiment, a bottom cell is formed using a thin single crystal semiconductor layer obtained by detaching thin part of a single crystal semiconductor substrate and a top cell is formed in which a non-single-crystal semiconductor layer is present over the thin single crystal semiconductor layer.

Figure 1:
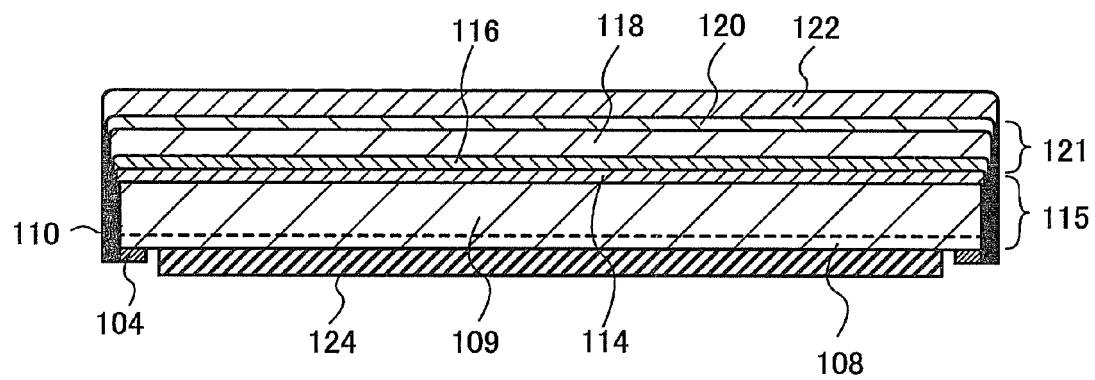
FIG. 1 is a cross-sectional view showing a structure of a photoelectric conversion device.

FIG. 1 shows an example of a cross-sectional view of a photoelectric conversion device according to the present invention.

A photoelectric conversion device described in this embodiment is provided with a stacked structure of a first unit cell 115 having a single crystal semiconductor layer and a second unit cell 121 having a non-single-crystal semiconductor layer. The stacked structure of the first unit cell 115 and the second unit cell 121 is sandwiched between a pair of electrodes including a first electrode 122 and a second electrode 124. The second electrode 124 is provided over a surface of the first unit cell 115 on the side opposite to the second unit cell 121. The first electrode 122 is provided over a surface of the second unit cell 121 on the side opposite to the first unit cell 115. Note that the photoelectric conversion device described in this embodiment produces a photoelectric effect by light from the first electrode 122 side with which the second unit cell 121 is in contact. Here, a main light-receiving surface is on the first electrode 122 side, and a back surface is on the second electrode 124 side.

In specific, a thin single crystal semiconductor layer 110 including a first impurity semiconductor layer 108 is formed over the second electrode 124, and a second impurity semiconductor layer 114 is formed over the thin single crystal semiconductor layer 110. A third impurity semiconductor layer 116, a non-single-crystal semiconductor layer 118, and a fourth impurity semiconductor layer 120 are stacked in this order over the second impurity semiconductor layer 114, and the first electrode 122 is formed over the fourth impurity semiconductor layer 120. Further, the insulating layer 104 is formed in a peripheral edge portion of a surface of the thin single crystal semiconductor layer 110 on which the second electrode 124 is formed. Furthermore, an example is described in which, on a side surface of the photoelectric conversion device shown in FIG. 1, the second impurity semiconductor layer 114 is formed to cover the thin single crystal semiconductor layer 110, the third impurity semiconductor layer 116 is formed to cover the second impurity semiconductor layer 114, the non-single-crystal semiconductor layer 118 is formed to cover the third impurity semiconductor layer 116, the fourth impurity semiconductor layer 120 is formed to cover the non-single-crystal semiconductor layer 118, and the first electrode 122 is formed to cover the fourth impurity semiconductor layer 120. The insulating layer 104 is provided between the second electrode 124 and a stacked structure of the second impurity semiconductor layer 114, the third impurity semiconductor layer 116, the non-single-crystal semiconductor layer 118, the fourth impurity semiconductor layer 120, and the first electrode 122 which is formed on the side surface.

The first unit cell 115 includes the thin single crystal semiconductor layer 110 and the second impurity semiconductor layer 114. Further, the first impurity semiconductor layer 108 is formed on the one surface side of the thin single crystal semiconductor layer 110. The first impurity semiconductor layer 108 is provided on the side of the thin single crystal semiconductor layer 110 which is in contact with the second electrode 124. Note that a region of the thin single crystal semiconductor layer 110 in which the first impurity semiconductor layer 108 is not formed is also referred to as a non-diffusion single crystal semiconductor layer 109 for the sake of convenience. The second impurity semiconductor layer 114 is provided over a surface of the thin single crystal semiconductor layer 110 on the side opposite to the second electrode 124.

The thin single crystal semiconductor layer 110 is detached thin part of a single crystal semiconductor substrate, and has a thickness of greater than or equal to 1 μm and less than or equal to 10 μm, preferably greater than or equal to 3 μm and less than or equal to 5 μm. Typically, single crystal silicon is used for the thin single crystal semiconductor layer 110, and in that case, the single crystal semiconductor layer 110 is a thin single crystal silicon layer. For example, a single crystal semiconductor substrate is irradiated with ions by an ion implantation method or an ion doping method, and then, part of the single crystal semiconductor substrate is separated by heat treatment, whereby the thin single crystal semiconductor layer 110 can be obtained. Alternatively, a method may be employed in which a single crystal semiconductor substrate is irradiated with a laser beam which makes multiphoton absorption occur and a part of the single crystal semiconductor substrate is then separated. Note that in the case of using a polycrystalline semiconductor substrate instead of a single crystal semiconductor substrate, a thin polycrystalline semiconductor layer (typically a thin polycrystalline silicon layer) is separated, not the thin single crystal semiconductor layer.

Note that in this specification, "ion implantation" refers to a method in which ions generated from a source gas are mass separated and introduced to an object, while "ion doping" refers to a method in which ions generated from a source gas are introduced to an object without mass separation.

The first impurity semiconductor layer 108 includes an impurity element imparting one conductivity type. The second impurity semiconductor layer 114 includes an impurity element imparting one conductivity type opposite to that of the first impurity semiconductor layer 108. The first impurity semiconductor layer 108 and the second impurity semiconductor layer 114 have opposite conductivity types. As an impurity element imparting one conductivity type, an impurity element imparting n-type conductivity or an impurity element imparting p-type conductivity is used. That is, the first impurity semiconductor layer 108 includes one of the impurity element imparting n-type conductivity and the impurity element imparting p-type conductivity, and the second impurity semiconductor layer 114 includes the impurity element imparting the other conductivity. Preferably, the first impurity semiconductor layer 108 is formed using an n-type semiconductor and the second impurity semiconductor layer 114 is formed using a p-type semiconductor. Needless to say, the first impurity semiconductor layer 108 may be of p type and the second impurity semiconductor layer 114 may be of n type. As the impurity element imparting n-type conductivity, an element belonging to Group 15 in the periodic table, such as phosphorus or arsenic, is used. As the impurity element imparting p-type conductivity, an element belonging to Group 13 in the periodic table, such as boron or aluminum, is used.

Into the side of the thin single crystal semiconductor layer 110 where the second electrode 124 is to be formed, an impurity element imparting one conductivity type (preferably an impurity element imparting n-type conductivity in this embodiment) is introduced by an ion implantation method, an ion doping method, a thermal diffusion method, or a laser doping method, whereby the first impurity semiconductor layer 108 can be formed. In the thin single crystal semiconductor layer 110, a region where the first impurity semiconductor layer 108 is not formed is referred to as the non-diffusion single crystal semiconductor layer 109. The non-diffusion single crystal semiconductor layer 109 exhibits the same conductivity type as the single crystal semiconductor substrate from which the thin single crystal semiconductor layer 110 is separated. When the single crystal semiconductor substrate from which the thin single crystal semiconductor layer 110 is separated is an n-type semiconductor substrate, the non-diffusion single crystal semiconductor layer 109 is formed using an n-type semiconductor. When the single crystal semiconductor substrate from which the thin single crystal semiconductor layer 110 is separated is a p-type semiconductor substrate, the non-diffusion single crystal semiconductor layer 109 is formed using a p-type semiconductor. As the non-diffusion single crystal semiconductor layer 109, an n-type semiconductor or a p-type semiconductor is used. The non-diffusion single crystal semiconductor layer 109 may have the same conductivity type as the first impurity semiconductor layer 108 or as the second impurity semiconductor layer 114. In the case where the non-diffusion single crystal semiconductor layer 109 and the first impurity semiconductor layer 108 have the same conductivity type, the non-diffusion single crystal semiconductor layer 109 preferably has a lower impurity concentration than the first impurity semiconductor layer 108. The first impurity semiconductor layer 108 and the non-diffusion single crystal semiconductor layer 109 are made different from each other in the concentration of an impurity included therein so that the first impurity semiconductor layer 108 has a higher impurity concentration than the non-diffusion single crystal semiconductor layer 109, whereby carrier collection efficiency can be increased.

As the second impurity semiconductor layer 114, a semiconductor layer including an impurity element imparting one conductivity type (preferably, an impurity element imparting p-type conductivity in this embodiment) is formed over a surface of the thin single crystal semiconductor layer 110 on the side opposite to the second electrode 124. In specific, the second impurity semiconductor layer 114 can be formed using a source gas in which a doping gas and a semiconductor material gas are mixed, by a chemical vapor deposition method, typically a plasma CVD method. The second impurity semiconductor layer 114 is formed using a microcrystalline semiconductor layer, an amorphous semiconductor layer, or a single crystal semiconductor layer. As the second impurity semiconductor layer 114, microcrystalline silicon is typically used.

The second unit cell 121 includes the third impurity semiconductor layer 116, the non-single-crystal semiconductor layer 118, and the fourth impurity semiconductor layer 120. The third impurity semiconductor layer 116 is provided on the first unit cell 115 side of the non-single-crystal semiconductor layer 118. The fourth impurity semiconductor layer 120 is provided over a surface of the non-single-crystal semiconductor layer 118 on the side opposite to the third impurity semiconductor layer 116. Further, the fourth impurity semiconductor layer 120 is provided on the first electrode 122 side.

The third impurity semiconductor layer 116 includes an impurity element imparting one conductivity type. Further, the third impurity semiconductor layer 116 is in contact with the second impurity semiconductor layer 114, and includes an impurity element imparting one conductivity type opposite to that of the second impurity semiconductor layer 114. The fourth impurity semiconductor layer 120 includes an impurity element imparting one conductivity type opposite to that of the third impurity semiconductor layer 116. The third impurity semiconductor layer 116 and the fourth impurity semiconductor layer 120 have opposite conductivity types. The same description as the first impurity semiconductor layer 108 and the second impurity semiconductor layer 114 can be given for the impurity element imparting one conductivity type. In the case where the second impurity semiconductor layer 114 is of p type, the third impurity semiconductor layer 116 is of n type and the fourth impurity semiconductor layer 120 is of p type. Alternatively, in the case where the second impurity semiconductor layer 114 is of n type, the third impurity semiconductor layer 116 is of p type and the fourth impurity semiconductor layer 120 is of n type.

As the third impurity semiconductor layer 116, a semiconductor layer including an impurity element imparting a conductivity type opposite to that of the second impurity semiconductor layer 114 (preferably, an impurity element imparting n-type conductivity in this embodiment) is formed on the side of the non-single-crystal semiconductor layer 118 where the second impurity semiconductor layer 114 is formed. As the fourth impurity semiconductor layer 120, a semiconductor layer including an impurity element imparting a conductivity type opposite to that of the third impurity semiconductor layer 116 (preferably, an impurity element imparting p-type conductivity in this embodiment) is formed over the non-single-crystal semiconductor layer 118 on the side opposite to the third impurity semiconductor layer 116. In specific, the third impurity semiconductor layer 116 and the fourth impurity semiconductor layer 120 can be formed using a source gas in which a doping gas and a semiconductor material gas are mixed, by a plasma CVD method. The third impurity semiconductor layer 116 and the fourth impurity semiconductor layer 120 are each formed using either a microcrystalline semiconductor layer or an amorphous semiconductor layer, typically microcrystalline silicon.

The non-single-crystal semiconductor layer 118 is formed using an amorphous semiconductor layer or a microcrystalline semiconductor layer, and typically, amorphous silicon or microcrystalline silicon is used. Since amorphous silicon has a high absorption coefficient in the wavelength range of sunlight, amorphous silicon is preferably used as the non-single-crystal semiconductor layer 118. For example, the non-single-crystal semiconductor layer 118 can be formed using a source gas including a semiconductor material gas by a plasma CVD method.

The second electrode 124 is provided in contact with the first unit cell 115. The second electrode 124 is provided on the back surface side of the photoelectric conversion device of this embodiment, and thus, the second electrode 124 can also be referred to as a back surface electrode. The first electrode 122 is provided in contact with the second unit cell 121. The first electrode 122 is provided on the main light-receiving surface side of the photoelectric conversion device of this embodiment, and thus, the first electrode 122 can also be referred to as a light-receiving surface electrode. In the photoelectric conversion device of this embodiment, one of the second electrode 124 and the first electrode 122 corresponds to a positive electrode and the other corresponds to a negative electrode. The photoelectric conversion device of this embodiment has a structure in which an electrode corresponding to a positive electrode and an electrode corresponding to a negative electrode are provided on opposite sides of the first unit cell 115 and the second unit cell 121 which converts light into electricity.

In the photoelectric conversion device of this embodiment, the first unit cell 115 preferably has a p-n structure, the second unit cell 121 preferably has a p-i-n structure, and a p-n junction is formed at a junction between the first unit cell 115 and the second unit cell 121. In other words, the p-n junction is preferably formed at the junction between the second impurity semiconductor layer 114 and the third impurity semiconductor layer 116. Further, preferably, a p-type semiconductor is provided on the light incidence side and an n-type semiconductor is provided on the back surface side. In other words, preferably, a p-type semiconductor is provided in contact with the first electrode 122 on the light incidence side and an n-type semiconductor is provided in contact with the second electrode 124 on the back surface side. This is because the movement distance of holes is preferably short in consideration of hole carrier lifetime since the second unit cell including a non-single-crystal semiconductor layer is provided on the light incidence side.

The thin single crystal semiconductor layer 110 in contact with the second electrode 124 on the back surface side is of p type, and the first impurity semiconductor layer 108 of $p^+$ type at a higher concentration than the thin single crystal semiconductor layer 110 is formed by further introducing an impurity element imparting p-type conductivity to the thin single crystal semiconductor layer 110. Thus, a back surface field (BSF) can be formed. A light confinement effect due to BSF can prevent recombination of carriers (electrons and holes) generated by photoexcitation, and a carrier collection efficiency can be increased. Note that in this case, an n-type semiconductor is provided in contact with the first electrode 122 on the light incidence side.

Next, an example of a method for manufacturing the photoelectric conversion device according to this embodiment is described with reference to FIGS. 2A to 2C, FIGS. 3A to 3C, and FIGS. 4A and 4B.

Figure 2A:
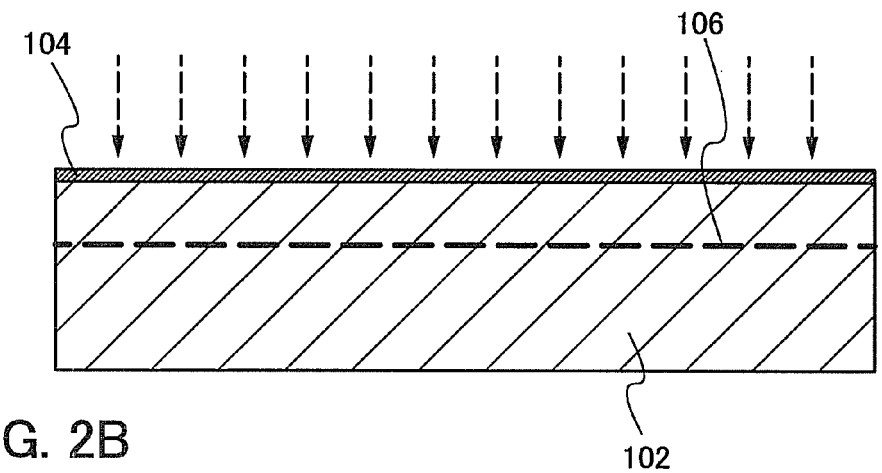
FIGS. 2A to 2C are cross-sectional views showing a method for manufacturing a photoelectric conversion device.

An embrittled layer 106 is formed in a region of a single crystal semiconductor substrate 102 at a predetermined depth from one surface of the single crystal semiconductor substrate 102 (see FIG. 2A).

As the single crystal semiconductor substrate 102, a single crystal silicon substrate is typically used. Further, a known single crystal semiconductor substrate can be used as the single crystal semiconductor substrate 102. For example, a single crystal germanium substrate, a single crystal silicon germanium substrate, or the like can be used. Furthermore, in the present invention, a polycrystalline semiconductor substrate can be used as an alternative to the single crystal semiconductor substrate 102, and a polycrystalline silicon substrate can be typically used. In the case where a polycrystalline semiconductor substrate is used as an alternative to a single crystal semiconductor substrate, the term "single crystal semiconductor" in the description below can be replaced with "polycrystalline semiconductor".

Although the size (the area, the planar shape, the thickness, or the like) of the single crystal semiconductor substrate 102 used in the present invention is not limited in particular, a large-area substrate is preferably used. The sizes of generally distributed single crystal silicon substrates are 100 mm (4 inches) in diameter, 150 mm (6 inches) in diameter, 200 mm (8 inches) in diameter, 300 mm (12 inches) in diameter, and the like. In recent years, the distributions of single crystal silicon substrates which are 400 mm (16 inches) in diameter have begun. Further, it is expected that a single crystal silicon substrate is increased to 16 inches or more in diameter in future, and it has already been expected that a substrate is increased to 450 mm (18 inches) in diameter so that the substrate is used as a next-generation substrate. As the single crystal semiconductor substrate 102, a substrate which is 300 mm or more in diameter is preferably used. For example, a substrate which is 400 mm in diameter or 450 mm in diameter is preferably used. By increasing the single crystal semiconductor substrate 102 in diameter or by enlarging the area of the single crystal semiconductor substrate 102, productivity can be increased. Further, at the time of manufacturing a solar-electric power generation module, an area of an opening (non-electricity generation region) which is generated by arranging a plurality of unit cells can be reduced.

The planar shape of the single crystal semiconductor substrate 102 is not limited in particular. A generally distributed circular substrate or a substrate which is processed into a desired shape can be used. Further, the single crystal semiconductor substrate 102 may have a thickness of a generally distributed substrate which conforms to the SEMI Standard, or may have a thickness which is adjusted as appropriate at the time of cutting out the single crystal semiconductor substrate 102 from an ingot. By cutting out a thick single crystal semiconductor substrate from an ingot, a material loss corresponding to a cutting margin can be reduced. Note that the size (the area, the planar shape, the thickness, or the like) of the single crystal semiconductor substrate 102 may be adapted to the specifications or the like of the apparatus used in a manufacturing process of the single crystal semiconductor substrate 102 or a photoelectric conversion device using the single crystal semiconductor substrate 102. For example, an n-type single crystal silicon substrate can be used as the single crystal semiconductor substrate 102.

The embrittled layer 106 refers to a region at which the single crystal semiconductor substrate 102 is divided into a thin single crystal semiconductor layer and a substrate to be reused (a single crystal semiconductor substrate) in a division step which is described later, and its vicinity. The thickness of the thin single crystal semiconductor layer which is divided later is determined by the depth at which the embrittled layer 106 is formed. One of the main points of the present invention is to structure a photoelectric conversion device using detached thin part of a single crystal semiconductor substrate. The thickness of the thin single crystal semiconductor layer, which is the detached thin part of the single crystal semiconductor substrate, is greater than or equal to 1 µm and less than or equal to 10 µm, preferably greater than or equal to 3 µm and less than or equal to 5 µm. Thus, the depth at which the embrittled layer 106 is formed is controlled so that a thin single crystal semiconductor layer with a desired thickness which is greater than or equal to 1 µm and less than or equal to 10 µm, preferably greater than or equal to 3 µm and less than or equal to 5 µm is obtained.

A method for forming the embrittled layer 106 may be any as long as thin part of a single crystal semiconductor substrate with a desired thickness can be detached. Specifically, an ion implantation method or an ion doping method in which a substrate is irradiated with ions (typically hydrogen ions) accelerated by voltage, a method utilizing multiphoton absorption, and the like are given. Preferably, a method is used which allows the embrittled layer 106 to be formed in a deep portion below the one surface side of the single crystal semiconductor substrate 102. In this embodiment, an example is described in which the embrittled layer 106 is formed by a method in which a substrate is irradiated with ions accelerated by voltage.

In this embodiment, an example is described in which the embrittled layer 106 is formed in a region at a predetermined depth from the one surface of the single crystal semiconductor substrate 102 by irradiation with ions accelerated by voltage from the one surface side of the single crystal semiconductor substrate 102. The single crystal semiconductor substrate 102 is irradiated with ions (typically hydrogen ions) accelerated by voltage, whereby the ions used for irradiation or elements forming the ions (typically hydrogen) can be introduced into the single crystal semiconductor substrate 102. The crystal structure of the single crystal semiconductor substrate 102 is locally distorted by irradiation with the ions accelerated by voltage, and the single crystal semiconductor substrate 102 is locally embrittled. Thus, the embrittled layer 106 is formed.

The depth at which the embrittled layer 106 is formed (here, the depth from the irradiated surface or from the irradiated surface side of the single crystal semiconductor substrate to the embrittled layer 106 in a film thickness direction) can be controlled by an acceleration voltage of ions for irradiation, a tilt angle (an inclination angle of the substrate), or/and the like. Therefore, the intensity of voltage by which ions are accelerated or/and the tilt angle is/are determined by the depth at which the embrittled layer 106 is formed, that is, by the thickness of the thin single crystal semiconductor layer which is to be separated.

As ions with which the single crystal semiconductor substrate 102 is irradiated in order to form the embrittled layer 106, hydrogen ions generated from a source gas including hydrogen is typically used. By irradiation of the single crystal semiconductor substrate 102 with hydrogen ions, hydrogen is introduced into the single crystal semiconductor substrate 102. Thus, the embrittled layer 106 is formed. For example, hydrogen plasma is produced from a source gas including hydrogen, and ions generated in the hydrogen plasma are accelerated by voltage and the single crystal semiconductor substrate 102 is irradiated with the accelerated ions, whereby the embrittled layer 106 can be formed. Further, the embrittled layer 106 may be formed using ions generated from a source gas including a rare gas typified by helium, instead of hydrogen.

The single crystal semiconductor substrate 102 is irradiated with ions with the acceleration voltage, the dose, and the tilt angle controlled, whereby the embrittled layer 106 which is a highly doped region can be locally formed in a region of the single crystal semiconductor substrate 102 at a predetermined depth. That is, the concentration of the doped region which is the embrittled layer 106 can be controlled by the dose of ions, the acceleration voltage, the tilt angle, or the like. For example, in the case of forming the embrittled layer 106 by irradiation with hydrogen ion, it is preferable that hydrogen atoms at $1 \times 10^{19}$ atoms/cm$^3$ or more be contained in the embrittled layer 106. When the highly doped region of hydrogen is formed locally in the single crystal semiconductor substrate 102, a crystal structure is damaged and microvoids are formed. Therefore, the embrittled layer 106 formed in the single crystal semiconductor substrate 102 has a porous structure. In the embrittled layer 106 as described above, the microvoids are changed in volume by heat treatment at a comparatively low temperature (lower than 700° C.), whereby the single crystal semiconductor substrate 102 can be divided along the embrittled layer 106 or along the vicinity of the embrittled layer 106.

The embrittled layer 106 can be formed using an ion implantation apparatus with mass separation or an ion doping apparatus without mass separation. An ion implantation apparatus is preferable because the embrittled layer 106 can be easily formed in a deep portion of the single crystal semiconductor substrate 102 when an ion implantation apparatus is used. That is, it is preferable that the embrittled layer 106 be formed by irradiation with ions by an ion implantation method. Further, it is preferable that the embrittled layer 106 be formed by irradiation with ions with the tilt angle set to be approximately 0° because the embrittled layer 106 can be easily formed in a deep portion of the single crystal semiconductor substrate 102.

Figure 19:
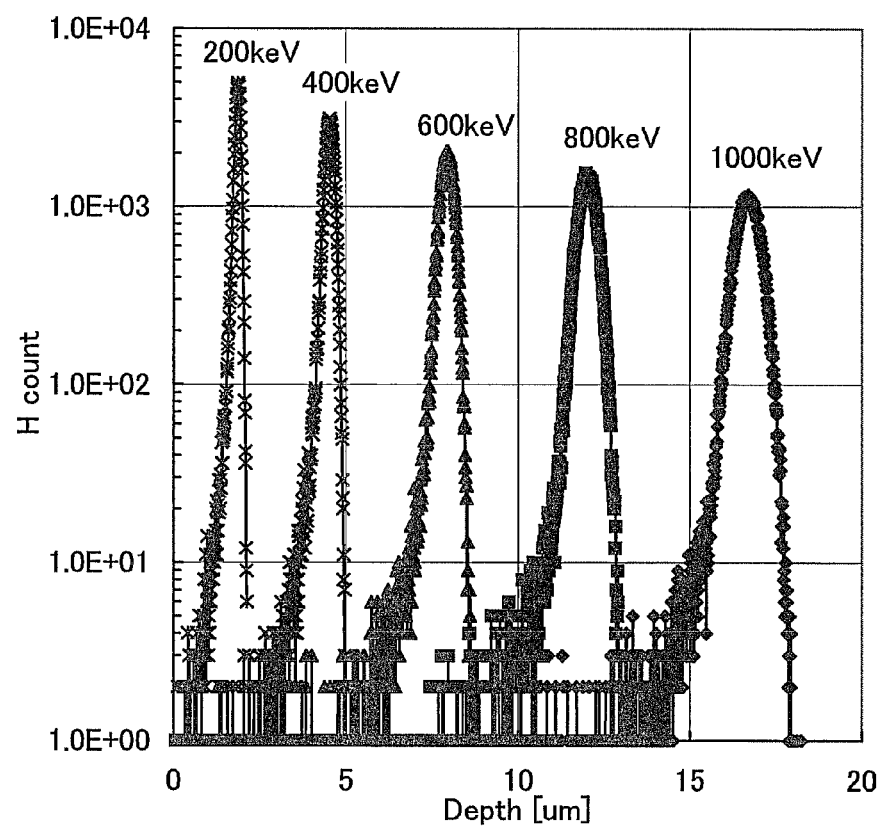
FIG. 19 is a graph showing the result of simulating a relation between acceleration energy and hydrogen concentration at the time of irradiation with hydrogen ions.

FIG. 19 shows the simulation result of a relation between acceleration energy and the peak position of the number of hydrogen atoms in a Si substrate at the time of irradiation of the single crystal semiconductor substrate with hydrogen ions. The simulation was performed using TRIM, the Transport of Ions in Matter, which is simulation software for ion introduction processes by a Monte Carlo method. FIG. 19 shows that the peak of hydrogen concentration is positioned at a depth of approximately 2 μm from the surface of the single crystal silicon substrate with acceleration energy of 200 keV, and in addition, the peak of hydrogen concentration can be positioned at a depth of approximately 10 μm or more from the surface of the single crystal silicon substrate by an increase of acceleration energy to 1000 keV. In other words, irradiation of the single crystal semiconductor substrate with hydrogen ions by a predetermined acceleration energy makes it possible to form the thin single crystal semiconductor layer with a thickness of greater than or equal to 1 μm and less than or equal to 10 μm, preferably greater than or equal to 3 μm and less than or equal to 5 μm.

Further, by irradiation with specific ions, a region of the single crystal semiconductor substrate 102 at a predetermined depth can be embrittled in a concentrated manner. For example, hydrogen plasma is produced from a source gas including hydrogen, hydrogen ions generated in the hydrogen plasma are subjected to mass separation, and the thus obtained hydrogen ions are accelerated by voltage to irradiate the single crystal semiconductor substrate 102 with the hydrogen ions, whereby the embrittled layer 106 can be formed.

Note that a protective layer is preferably formed in order to prevent the single crystal semiconductor substrate 102 from being damaged at the time of irradiating the single crystal semiconductor substrate 102 with ions. FIG. 2A shows an example in which the insulating layer 104 which can serve as a protective layer is formed over at least one surface of the single crystal semiconductor substrate 102 and the single crystal semiconductor substrate 102 is irradiated with ions accelerated by voltage from the side on which the insulating layer 104 is formed. The insulating layer 104 is irradiated with ions to introduce ions or elements forming the ions which have passed through the insulating layer 104 into the single crystal semiconductor substrate 102. In this manner, the embrittled layer 106 is formed in a region of the single crystal semiconductor substrate 102 at a predetermined depth.

As the insulating layer 104, an insulating layer such as a silicon oxide layer, a silicon nitride layer, a silicon nitride oxide layer, or a silicon oxynitride layer may be formed. For example, by oxidation treatment with ozone water or hydrogen peroxide or under an ozone atmosphere, a chemical oxide with a thickness of 2 nm to 5 nm can be formed as the insulating layer 104 over a surface of the single crystal semiconductor substrate 102. Alternatively, by a thermal oxidation method or oxygen radical treatment, an oxide layer with a thickness of 2 nm to 10 nm may be formed as the insulating layer 104 over a surface of the single crystal semiconductor substrate 102. Further alternatively, by a plasma CVD method, an insulating layer with a thickness of approximately 2 nm to 50 nm may be formed as the insulating layer 104.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations of higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0.1 at. % and lower than or equal to 10 at. %, respectively. Further, a silicon nitride oxide layer means a film that contains more nitrogen than oxygen and, in the case where measurements are performed using RBS and HFS, includes oxygen, nitrogen, silicon, and hydrogen at concentrations of higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Figure 2B:
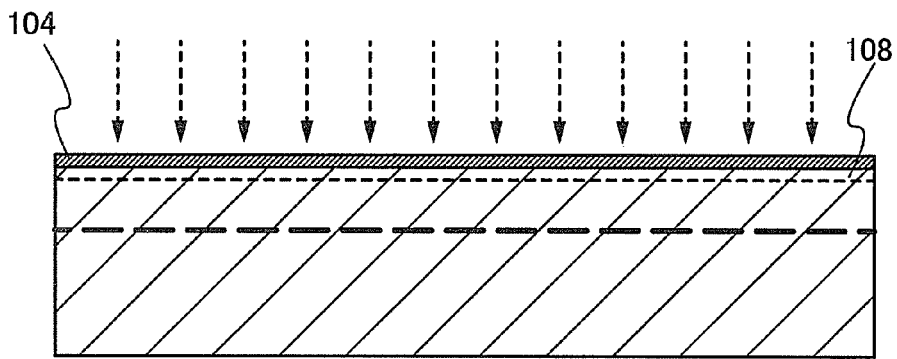

An impurity element imparting one conductivity type is introduced into the single crystal semiconductor substrate 102, whereby the first impurity semiconductor layer 108 is formed on the one surface side of the single crystal semiconductor substrate 102 (see FIG. 2B).

The first impurity semiconductor layer 108 is formed by introduction of an impurity element imparting one conductivity type by an ion doping method, an ion implantation method, a thermal diffusion method, or a laser doping method. In addition, the first impurity semiconductor layer 108 is formed on the surface side which remains as the thin single crystal semiconductor layer after division of the single crystal semiconductor substrate 102 in a later step (that is, on the surface side opposite to that of a division surface of the thin single crystal semiconductor layer). In this embodiment, an impurity element imparting n-type conductivity, typically phosphorus, arsenic, antimony, or the like, which is an element belonging to Group 15 in the periodic table, is used as the impurity element imparting one conductivity type. That is, the first impurity semiconductor layer 108 of n type is formed. For example, the first impurity semiconductor layer 108 of n type is formed by introduction of phosphorus. The introduction of phosphorus can be performed using an ion doping apparatus by which ions which are generated using phosphine as a source gas are accelerated by voltage without mass separation to irradiate a substrate with ion stream to be generated. Note that hydrogen or helium may be introduced into a source gas for introducing the impurity element imparting one conductivity type. For example, in this case, a source gas in which hydrogen or helium is introduced into $PH_3$ may be used. By using an ion doping apparatus, the area irradiated with an ion beam can be enlarged, so that the single crystal semiconductor substrate 102 can be processed efficiently even if the single crystal semiconductor substrate 102 has more than 300 mm in diagonal. For example, a linear ion beam whose long side has a length of more than 300 mm is formed and delivered from one end to the other end of the single crystal semiconductor substrate 102; thus, the first impurity semiconductor layer 108 can be formed at a uniform depth.

In this embodiment, the first impurity semiconductor layer 108 is formed on the one surface side of the single crystal semiconductor substrate 102 by introduction of the impurity element imparting one conductivity type from the side where the insulating layer 104 is formed. The impurity element imparting one conductivity type is introduced into the single crystal semiconductor substrate 102 through the insulating layer 104. Thus, the first impurity semiconductor layer 108 is formed on the side on which the insulating layer 104 is formed.

In the case of forming the first impurity semiconductor layer 108 of n type using the single crystal semiconductor substrate 102 of n type, a high-concentration n-type region ($n^+$ region) in which an n-type impurity element is introduced into the single crystal semiconductor substrate 102 of n type is formed as the first impurity semiconductor layer 108. In such a case, the single crystal semiconductor substrate 102 or a thin single crystal semiconductor layer separated from the single crystal semiconductor substrate 102 is also referred to as an n layer or an n region, and the first impurity semiconductor layer 108 is also referred to as an $n^+$ layer or an $n^+$ region. Similarly, in the case of forming the first impurity semiconductor layer 108 of p type using the single crystal semiconductor substrate 102 of p type, the single crystal semiconductor substrate 102 or the thin single crystal semiconductor layer separated from the single crystal semiconductor substrate 102 is also referred to as a p layer or a p region, and the first impurity semiconductor layer 108 is also referred to as a $p^+$ layer or a $p^+$ region.

Figure 2C:
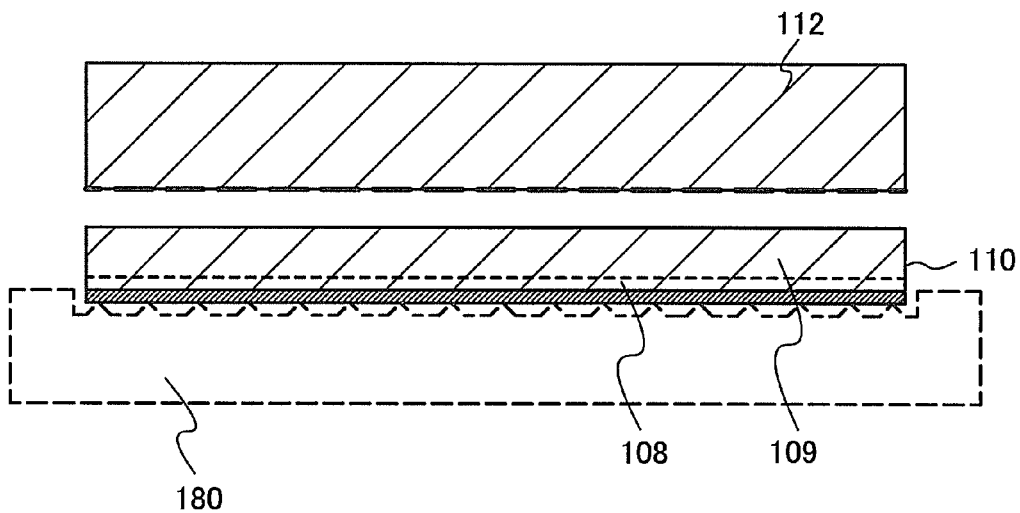

Thin part of the single crystal semiconductor substrate 102 is detached to obtain the thin single crystal semiconductor layer 110, which is the detached thin part of the single crystal semiconductor substrate (see FIG. 2C). The single crystal semiconductor substrate 102 is divided at the embrittled layer 106, and thus, the thin single crystal semiconductor layer 110 is separated from the single crystal semiconductor substrate 102. Further, the substrate to be reused 112 is obtained in which the thin single crystal semiconductor layer 110 has been separated from the single crystal semiconductor substrate 102.

The single crystal semiconductor substrate 102 can be divided by heat treatment. For the heat treatment, a heating furnace or rapid thermal annealing (RTA) can be used. Alternatively, dielectric heating using a high frequency such as a microwave may be performed by a high-frequency apparatus. The heat treatment temperature for dividing the single crystal semiconductor substrate 102 is preferably higher than or equal to 410° C. and less than the strain point of the single crystal semiconductor substrate 102. The heat treatment is performed at a temperature at least higher than or equal to 410° C., whereby microvoids formed in the embrittled layer 106 are changed in volume and the single crystal semiconductor substrate 102 can be divided along the embrittled layer 106. Further, for the heat treatment, rapid heating typified by irradiation using a laser beam, irradiation using a lamp, or the like can be used. RTA or rapid heat treatment such as irradiation with a laser beam or irradiation using a lamp makes it possible to perform heating at a temperature near the strain point of the single crystal semiconductor substrate 102 or at a temperature slightly higher than the strain point of the single crystal semiconductor substrate 102. In addition, by the heat treatment at the time of the division, an impurity element included in the first impurity semiconductor layer 108 can be activated.

Note that the thin single crystal semiconductor layer 110, which is the detached thin part of the single crystal semiconductor substrate, is provided with the first impurity semiconductor layer 108. A region of the thin single crystal semiconductor layer 110 where the first impurity semiconductor layer 108 is not formed is referred to as the non-diffusion single crystal semiconductor layer 109. The non-diffusion single crystal semiconductor layer 109 is a single crystal semiconductor layer. The non-diffusion single crystal semiconductor layer 109 is an n-type single crystal semiconductor layer when an n-type substrate is used as the single crystal semiconductor substrate 102, and the non-diffusion single crystal semiconductor layer 109 is a p-type single crystal semiconductor layer when a p-type substrate is used as the single crystal semiconductor substrate 102. In the case where the non-diffusion single crystal semiconductor layer 109 exhibits the same conductivity as the first impurity semiconductor layer 108, the impurity concentration of the non-diffusion single crystal semiconductor layer 109 is lower than that of the first impurity semiconductor layer 108. Further, the insulating layer 104 is formed over a surface of the thin single crystal semiconductor layer 110 on the first impurity semiconductor layer 108 side.

Further, in some cases, depressions and projections are formed in a division surface (separation surface) of the thin single crystal semiconductor layer 110 due to the division. The depressions and projections in the division surface can be reflected on a layer which is to be stacked on the thin single crystal semiconductor layer 110, so that depressions and projections can be formed in the main light-receiving surface side of a photoelectric conversion device to be completed. The depressions and projections formed in the main light-receiving surface side can serve as a textured surface, which allows improvement of light collection efficiency. The irradiation with ions accelerated by voltage and the division by heat treatment as described above makes it possible to form a surface texture structure without chemical etching or the like. Thus, improvement of photoelectric conversion efficiency can be realized in addition to cost reduction and process shortening.

At the time of dividing the single crystal semiconductor substrate 102, it is preferable to hold the thin single crystal semiconductor layer 110, which is the detached thin part of the single crystal semiconductor substrate. For example, it is preferable to hold the thin single crystal semiconductor layer 110 using a holding unit such as a substrate for holding, a tray, a vacuum chuck, or an electrostatic chuck. The holding unit is formed using a material which is not changed in property and in shape by the heat treatment at the time of division. In particular, it is preferable to select a material with less thermal expansion by the heat treatment. Further, the process after the division can be carried out with the thin single crystal semiconductor layer 110 held over the holding unit. In that case, a material which is not changed in property and in shape by heat treatment in the process after the division is selected for the holding unit. For example, as a material for forming the holding unit, quartz glass, stainless steel, non-alkaline glass, or the like can be selected. The single crystal semiconductor substrate 102 is disposed over the holding unit with the side of the single crystal semiconductor substrate 102 to be separated as the thin single crystal semiconductor layer 110 placed downward. By the division of the single crystal semiconductor substrate 102, the thin single crystal semiconductor layer 110 is held over the holding unit. FIG. 2C shows an example in which the thin single crystal semiconductor layer 110 is held over a tray which is a holding unit 180. The thin single crystal semiconductor layer 110 is held over the holding unit 180. Here, an example is illustrated in which the insulating layer 104 and the holding unit 180 are in contact with each other. In addition, here, an example is illustrated in which depressions and projections are formed in a surface of the holding unit 180 so that a surface of the insulating layer 104 is not entirely in contact with the holding unit 180. The insulating layer 104 and the holding unit 180 are in partial contact with each other as described above, whereby the thin single crystal semiconductor layer 110 provided with the insulating layer 104 can be prevented from being stuck on the holding unit.

The substrate to be reused 112 which is the single crystal semiconductor substrate obtained by separating the thin single crystal semiconductor layer 110 from the single crystal semiconductor substrate 102 can be repeatedly reused after being reprocessed. The substrate to be reused 112 may be used as a single crystal semiconductor substrate which is used for manufacturing a photoelectric conversion device, or may also be used for other uses. If the substrate is repeatedly reused as a single crystal semiconductor substrate from which a thin single crystal semiconductor layer is separated, a plurality of photoelectric conversion devices can be manufactured out of one material substrate.

Figure 3A:
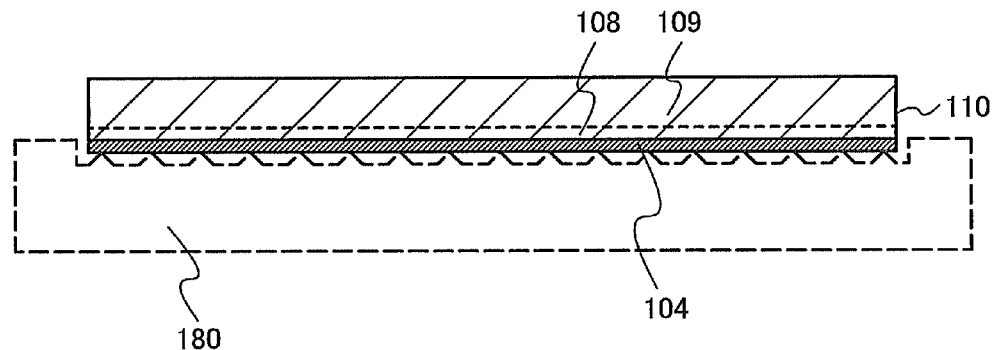
FIGS. 3A to 3C are cross-sectional views showing a method for manufacturing a photoelectric conversion device.

Next, the thin single crystal semiconductor layer 110 is subjected to heat treatment (see FIG. 3A). Note that in this specification, the heat treatment for the division described with reference to FIG. 2C is also referred to as "first heat treatment", and the heat treatment subsequent to the division is also referred to as "second heat treatment" for the sake of convenience. The second heat treatment is preferably performed at a temperature which is higher than the temperature of the first heat treatment and does not exceed the strain point of the thin single crystal semiconductor layer 110. Even in the case where the second heat treatment and the first heat treatment are performed at the same temperature, it is preferable that the treatment time of the second heat treatment be set to be longer than the treatment time of the first heat treatment. The second heat treatment can be performed using a heating furnace, RTA, irradiation with a laser beam, irradiation with lamp light, or the like in a manner similar to the first heat treatment. Further, the second heat treatment can be successively performed in an apparatus by which the first heat treatment has been performed or at a place where the first heat treatment has been performed. Furthermore, the second heat treatment can be performed with the thin single crystal semiconductor layer 110 held over the holding unit 180.

By the second heat treatment, the crystallinity of the thin single crystal semiconductor layer 110 can be recovered. For example, the crystallinity can be recovered which has been damaged at the time of forming the embrittled layer 106, specifically, by irradiation with ions. Further, damage which is caused at the time of the division by the first heat treatment can be repaired by the second heat treatment. Furthermore, by the second heat treatment, the residual stress in the thin single crystal semiconductor layer 110 can be relaxed.

Figure 3B:
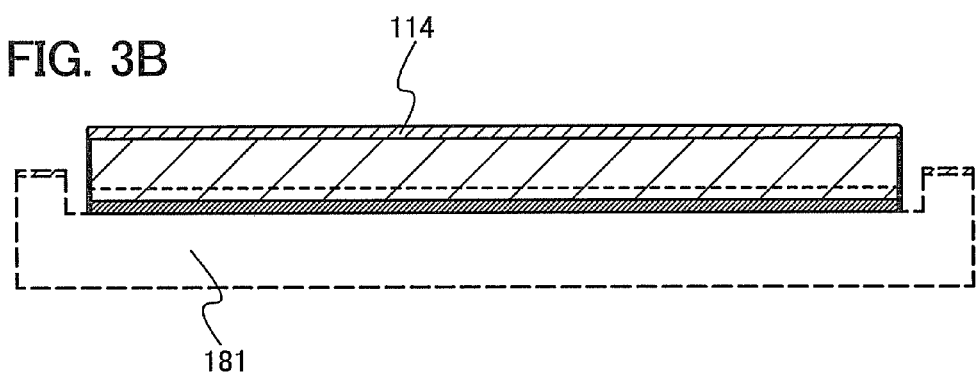

Over the division surface of the thin single crystal semiconductor layer 110, the second impurity semiconductor layer 114 is formed (see FIG. 3B). The second impurity semiconductor layer 114 is formed over the non-diffusion single crystal semiconductor layer 109.

The second impurity semiconductor layer 114 is a semiconductor layer including an impurity element imparting one conductivity type and exhibiting a conductivity type opposite to that of the first impurity semiconductor layer 108. In this embodiment, as the impurity element imparting one conductivity type which is included in the second impurity semiconductor layer 114, an impurity element imparting p-type conductivity, typically boron, aluminum, or the like, which is an element belonging to Group 13 in the periodic table, is used. Further, as a semiconductor layer which forms the second impurity semiconductor layer 114, a microcrystalline semiconductor layer, an amorphous semiconductor layer, a single crystal semiconductor layer, or the like can be used. Preferably, a microcrystalline semiconductor or an amorphous semiconductor, typically microcrystalline silicon is used for the second impurity semiconductor layer 114.

As the second impurity semiconductor layer 114, a microcrystalline semiconductor layer or an amorphous semiconductor layer can be formed using a mixed gas of a semiconductor material gas and hydrogen, a rare gas, or hydrogen and a rare gas by a plasma CVD method. As the semiconductor material gas, a silane-based gas of a chloride of silicon such as $SiH_2Cl_2$, $SiHCl_3$, or $SiCl_4$ or a fluoride of silicon such as $SiF_4$ as well as a hydride of silicon which is typified by silane or disilane can be used. Further, as the semiconductor material gas, a carbide gas such as $CH_4$ or $C_2H_6$ can be used instead of a silane-based gas or can be used by being mixed into a silane-based gas. Furthermore, a p-type semiconductor layer or an n-type semiconductor layer can be formed using gas obtained by mixing gas containing an impurity element imparting one conductivity type, which is a so-called doping gas, into the source gas. For example, the second impurity semiconductor layer 114 of p type can be formed using gas obtained by mixing gas including an impurity element imparting p-type conductivity (typically diborane) into the source gas. Alternatively, the second impurity semiconductor layer 114 of n type can be formed using gas obtained by mixing gas including an impurity element imparting n-type conductivity such as phosphorus, arsenic, or antimony (typically phosphine) into the source gas. The microcrystalline semiconductor layer or the amorphous semiconductor layer can be formed using the source gas or the source gas mixed with the doping gas by a plasma CVD apparatus in which plasma is produced by application of a high-frequency power with a power frequency of higher than or equal to 10 MHz and lower than or equal to 200 MHz. Instead of a high-frequency power, a microwave power with a power frequency of higher than or equal to 1 GHz and less than or equal to 5 GHz, typically 2.45 GHz may be applied.

In the film formation by the plasma CVD apparatus, the flow rate of hydrogen, a rare gas, or hydrogen and a rare gas is 10 times to 2000 times inclusive, preferably 50 times to 200 times inclusive, as high as the flow rate of the semiconductor material gas typified by a silane-based gas, whereby a microcrystalline semiconductor layer (typically a microcrystalline silicon layer) can be formed. Further, the flow rate of hydrogen, a rare gas, or hydrogen and a rare gas is 10 times to 2000 times inclusive, preferably one time to 10 times inclusive, as high as the flow rate of the semiconductor material gas (a silane-based gas), whereby an amorphous semiconductor layer (typically an amorphous silicon layer) can be formed. In the case of forming the second impurity semiconductor layer 114 of p type, diborane is mixed into the mixed gas of the semiconductor material gas (a silane-based gas) and a diluted gas (hydrogen, a rare gas, or hydrogen and a rare gas). In the case of forming the second impurity semiconductor layer 114 of n type, phosphine is mixed instead of diborane.

For example, the microcrystalline semiconductor layer or the amorphous semiconductor layer can be formed using glow discharge plasma produced by mixing a silane-based gas and hydrogen in a reaction chamber of a plasma CVD apparatus. Glow discharge plasma is produced by application of high-frequency power with a power frequency of higher than or equal to 3 MHz and lower than or equal to 30 MHz, typically 13.56 MHz or 27.12 MHz, or high-frequency power with a power frequency in the VHF band of 30 MHz to about 300 MHz, typically 60 MHz. The substrate is heated at a temperature of higher than or equal to 100° C. and lower than or equal to 300° C., preferably at a temperature of higher than or equal to 120° C. and lower than or equal to 220° C. A microcrystalline semiconductor or an amorphous semiconductor can be formed by changing a film formation condition such as the flow rate of various kinds of gases or applied power. Further, a p-type semiconductor layer can be formed using gas obtained by mixing gas including boron, aluminum, or the like and the source gas. Alternatively, an n-type semiconductor layer can be formed using gas obtained by mixing gas including phosphorus, arsenic, antimony, or the like and the source gas. Here, as the second impurity semiconductor layer 114, a microcrystalline silicon layer including boron, which is a p-type semiconductor layer, can be formed by glow discharge plasma produced by mixing silane, hydrogen and/or a rare gas, and diborane.

The thickness of the second impurity semiconductor layer 114 is greater than or equal to 5 nm and less than or equal to 20 nm, preferably greater than or equal to 10 nm and less than or equal to 15 nm.

Note that in the case where a material layer such as a native oxide layer which is not a semiconductor, is formed over the thin single crystal semiconductor layer 110, the material layer such as a native oxide layer is preferably removed before forming the second impurity semiconductor layer 114. The native oxide layer can be removed by wet etching using hydrofluoric acid or dry etching. For example, treatment using hydrofluoric acid is performed until a surface of the thin single crystal semiconductor layer 110 on the division surface side exhibits water repellency. The removal of the oxide layer from the surface of the thin single crystal semiconductor layer 110 on the division surface side can be confirmed by the water repellency. Further, at the time of forming the second impurity semiconductor layer 114, plasma treatment is performed using a mixed gas of hydrogen and a rare gas, for example, a mixed gas of hydrogen and helium or a mixed gas of hydrogen, helium, and argon, before the semiconductor material gas is introduced. By such plasma treatment, a native oxide layer or an element in the atmosphere (oxygen, nitrogen, or carbon) over the thin single crystal semiconductor layer 110 can be removed.

The second impurity semiconductor layer 114 can alternatively be formed by introducing an impurity element imparting one conductivity type (for example, an impurity element imparting p-type conductivity) into the thin single crystal semiconductor layer 110 on the division surface side. The introduction of an impurity element imparting one conductivity type may be performed in a manner similar to the formation of the first impurity semiconductor layer 108, and can be performed by an ion doping method, an ion implantation method, or a laser doping method. Further, the introduction of an impurity element imparting one conductivity type can be performed by a thermal diffusion method.

Through the above-described steps, the first unit cell 115 with a stacked structure of the thin single crystal semiconductor layer 110 and the second impurity semiconductor layer 114 is obtained. A main portion of the first unit cell 115 which converts light into electricity is formed using a single crystal semiconductor layer.

Figure 3C:
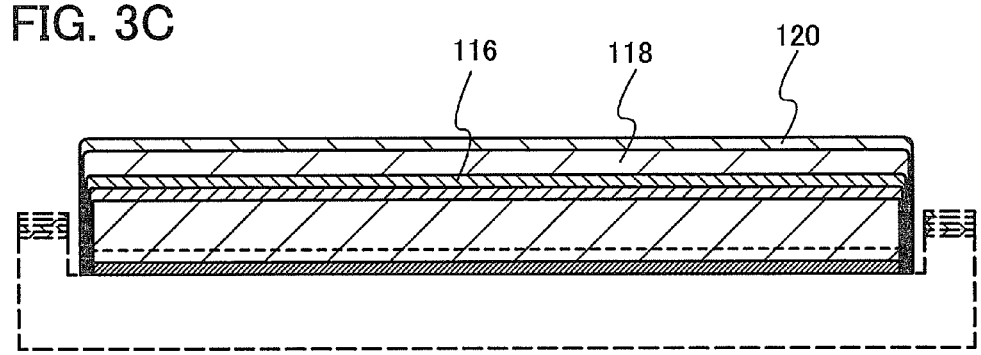

The third impurity semiconductor layer 116, the non-single-crystal semiconductor layer 118, and the fourth impurity semiconductor layer 120 are sequentially formed over the second impurity semiconductor layer 114 (see FIG. 3C).

The third impurity semiconductor layer 116 is formed using a microcrystalline semiconductor or an amorphous semiconductor, typically microcrystalline silicon, which has a conductivity type opposite to that of the second impurity semiconductor layer 114. The fourth impurity semiconductor layer 120 is formed using a microcrystalline semiconductor or an amorphous semiconductor, typically microcrystalline silicon, which has a conductivity type opposite to that of the third impurity semiconductor layer 116. The third impurity semiconductor layer 116 and the fourth impurity semiconductor layer 120 may be formed in a manner similar to the second impurity semiconductor layer 114. Specifically, the third impurity semiconductor layer 116 and the fourth impurity semiconductor layer 120 can be formed using a source gas in which a doping gas is mixed into a mixed gas of a semiconductor material gas and a diluted gas by a plasma CVD method. The third impurity semiconductor layer 116 is formed to a thickness of greater than or equal to 10 nm and less than or equal to 50 nm, preferably greater than or equal to 20 nm and less than or equal to 30 nm. The fourth impurity semiconductor layer 120 is formed to a thickness of greater than or equal to 5 nm and less than or equal to 20 nm, preferably greater than or equal to 10 nm and less than or equal to 15 nm. In this embodiment, an n-type microcrystalline silicon layer is formed as the third impurity semiconductor layer 116, and, for example, phosphine is used as a doping gas. Further, a p-type microcrystalline silicon layer is formed as the fourth impurity semiconductor layer 120, and, for example, diborane is used as a doping gas.

The non-single-crystal semiconductor layer 118 is formed using an amorphous semiconductor or a microcrystalline semiconductor, typically amorphous silicon or microcrystalline silicon. Specifically, the non-single-crystal semiconductor layer 118 is formed using a mixed gas of a semiconductor material gas and hydrogen, a rare gas, or hydrogen and a rare gas as a source gas by a plasma CVD method. As the semiconductor material gas, a silane-based gas of a fluoride of silicon or a chloride of silicon as well as a hydride of silicon which is typified by silane or disilane can be used, and further, a carbide gas such as $CH_4$ or $C_2H_6$ can be used. The non-single-crystal semiconductor layer 118 can be formed by a plasma CVD apparatus in a manner similar to the second impurity semiconductor layer 114, the third impurity semiconductor layer 116, and the fourth impurity semiconductor layer 120.

The non-single-crystal semiconductor layer 118 is formed to a thickness of greater than or equal to 100 nm and less than or equal to 300 nm, preferably greater than or equal to 150 nm and less than or equal to 200 nm. With the thickness of the non-single-crystal semiconductor layer 118 in the above-described range, light in the wavelength region shorter than 600 nm can be absorbed and can be converted into electricity.

Further, in the case where the third impurity semiconductor layer 116 and the fourth impurity semiconductor layer 120 are each formed using a microcrystalline semiconductor layer and the non-single-crystal semiconductor layer 118 is formed using an amorphous semiconductor layer, light can be efficiently absorbed by the non-single-crystal semiconductor layer 118. Furthermore, the third impurity semiconductor layer 116 and the fourth impurity semiconductor layer 120 can be formed using a semiconductor layer with an energy gap wider than the non-single-crystal semiconductor layer 118. With such a structure, light can also be efficiently absorbed by the non-single-crystal semiconductor layer 118. The improvement of the absorptance of light in the non-single-crystal semiconductor layer 118 can lead to the improvement of photoelectric conversion efficiency.

Through the above-described steps, the second unit cell 121 with a stacked structure of the third impurity semiconductor layer 116, the non-single-crystal semiconductor layer 118, and the fourth impurity semiconductor layer 120 is obtained. A main portion of the second unit cell 121 which converts light into electricity is formed using a non-single-crystal semiconductor layer.

Figure 4A:
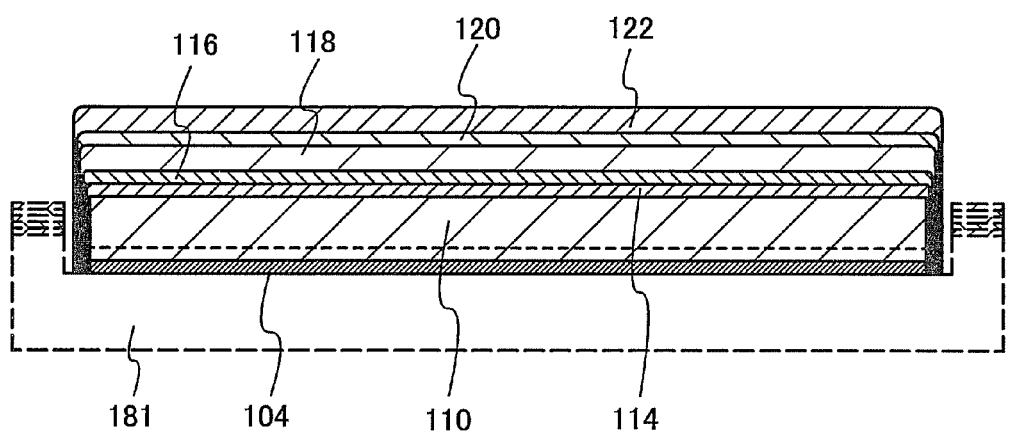
FIGS. 4A and 4B are cross-sectional views showing a method for manufacturing a photoelectric conversion device.

The first electrode 122 is formed over the fourth impurity semiconductor layer 120 (see FIG. 4A).

The first electrode 122 is formed using a transparent conductive material in order to make light enter the first electrode 122. Thus, the first electrode 122 is formed as a transparent electrode. As the transparent conductive material, metal oxide such as an alloy of indium tin oxide (ITO), zinc oxide, tin oxide, an alloy of indium oxide and zinc oxide, or the like is used. The first electrode 122 is formed to a thickness of 40 nm to 200 nm, preferably 50 nm to 100 nm. In addition, the sheet resistance of the first electrode 122 is set to be about 20 Ω/square to 200 Ω/square.

The first electrode 122 can be formed by a sputtering method, a vacuum evaporation method, or a screen printing method.

Note that a conductive high molecular material (also referred to as a "conductive polymer") can be used instead of the above-described metal oxide to form the first electrode 122. As the conductive high molecular material, π electron conjugated conductive polymer can be used. For example, polyaniline and/or a derivative thereof, polypyrrole and/or a derivative thereof, polythiophene and/or a derivative thereof, and a copolymer of two or more kinds of those materials can be given as the π electron conjugated conductive polymer.

Further, although not shown here, an anti-reflective layer may be formed over the first electrode 122. As the anti-reflective layer, it is preferable to form a layer whose refractive index is between the refractive index of air and the refractive index of a material of the main light-receiving surface of the photoelectric conversion device (in this embodiment, a material for forming the first electrode 122), and whose transmittance does not interrupt light incidence. The anti-reflective layer can be formed using a silicon oxide layer, a tantalum oxide layer, a silicon nitride layer, a silicon nitride oxide layer, a titanium nitride layer, a magnesium fluoride layer, or the like. By the formation of the anti-reflective layer, the reflectance can be reduced with the use of the effect of interference of light, which can lead to the improvement of photoelectric conversion efficiency.

Figure 4B:
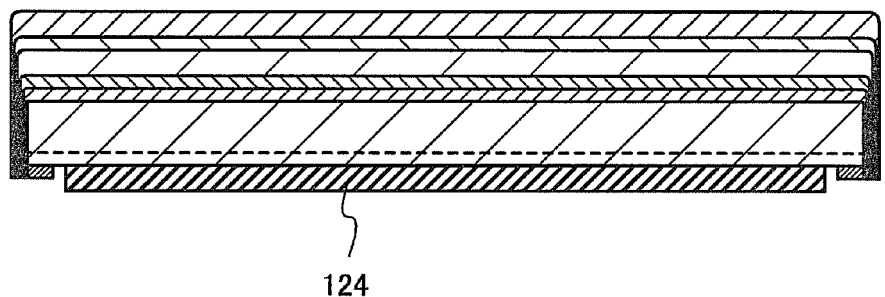

Next, the insulating layer 104 is selectively etched to be left in the peripheral edge portion of the thin single crystal semiconductor layer 110, and then, the second electrode 124 is formed in a region in which the insulating layer 104 has been removed (see FIG. 4B).

The insulating layer 104 can be removed by a photolithography method and an etching method. For example, a mask (typically a resist mask) is selectively formed over the insulating layer 104 by a photolithography method, and the insulating layer 104 is selectively etched using the mask. Here, the resist mask is formed so that the insulating layer 104 is left in the peripheral edge portion of the thin single crystal semiconductor layer 110, and the insulating layer 104 is etched using the resist mask.

There is no particular limitation on the second electrode 124 as long as the second electrode 124 is formed using a conductive material. For example, the second electrode 124 can be formed using a conductive material such as a metal material of titanium, aluminum, gold, platinum, silver, copper, nickel, chromium, tungsten, iron, tantalum, molybdenum, or the like, or an alloy of the metal material. Preferably, the second electrode 124 is formed to be a reflective electrode, whereby light collection efficiency can be improved. The second electrode 124 can be formed by a sputtering method, a vacuum evaporation method, a screen printing method, or a plating method. Further, the second electrode 124 can be formed to have a single layer structure or a stacked structure. In the case where the second electrode 124 has a stacked structure, the stacked structure can be a stacked structure formed using a plurality of metal materials selected from the above-described metal materials or can be a stacked structure of a layer of the metal material and a nitride layer of the metal material. In the case where the second electrode 124 has a stacked structure formed using a nitride layer of a metal material, the stacked structure can be a stacked structure of a layer of one metal material and a nitride layer of a metal material different from the one metal material. In the case where the second electrode 124 has a stacked structure of a layer of a metal material and a nitride layer of a metal material, a structure in which the nitride layer of a metal material is in contact with the thin single crystal semiconductor layer 110 is employed. For example, a single layer structure of a titanium layer, a stacked structure of a titanium layer and an aluminum layer, or a stacked structure of a titanium layer and a titanium nitride layer is formed as the second electrode 124. By interposing a nitride layer of a metal material between the thin single crystal semiconductor layer 110 and a layer of a metal material, adhesion between the thin single crystal semiconductor layer 110 and the second electrode 124 can be improved.

FIG. 4B shows an example in which the second impurity semiconductor layer 114, the third impurity semiconductor layer 116, the non-single-crystal semiconductor layer 118, and the fourth impurity semiconductor layer 120 which are formed by a plasma CVD method, and the first electrode 122 which is formed by a sputtering method are formed on side surfaces of the thin single crystal semiconductor layer 110. Since the insulating layer 104 is located in the peripheral edge portion of the thin single crystal semiconductor layer 110, a short circuit between the second electrode 124 and the first electrode 122, the fourth impurity semiconductor layer 120, the non-single-crystal semiconductor layer 118, the third impurity semiconductor layer 116, or the second impurity semiconductor layer 114 is not caused. Further, preferably, the second electrode 124 is selectively formed in a region in which the insulating layer 104 has been removed. For example, with the use of a shadow mask, the second electrode 124 can be selectively formed. Thus, a short circuit between the second electrode 124 and the first electrode 122 or the like can be prevented.

Note that by using a holding unit in and after a step of separating the thin single crystal semiconductor layer 110, failure such as warpage of a substrate in a manufacturing process can be prevented. In particular, in the case of using the single crystal semiconductor substrate 102 whose area is large, the area of the thin single crystal semiconductor layer 110 to be separated is also large. Therefore, it is effective to prevent warpage or the like with the use of the holding unit 180 shown in FIG. 2C, a holding unit 181 shown in FIG. 3B, or the like. Note that it is possible to use separate holding units for each step.

Thus, the photoelectric conversion device according to the present invention can be manufactured. The photoelectric conversion device described in this embodiment is a so-called tandem-type photoelectric conversion device in which the first unit cell 115 having a single crystal semiconductor layer and the second unit cell 121 having a non-single-crystal semiconductor layer are stacked. With the use of the first unit cell 115 having a single crystal semiconductor layer as a bottom cell, light with a long wavelength of 800 nm or more can be absorbed and can be converted into electricity. Further, with the use of the second unit cell 121 having a non-single-crystal semiconductor layer as a top cell, light with a shorter wavelength which cannot be absorbed by the bottom cell can be absorbed and can be converted into electricity. Accordingly, the photoelectric conversion efficiency of the photoelectric conversion device can be improved.

Thin part of a thin single crystal semiconductor substrate is detached, and the detached thin part of the single crystal semiconductor substrate (thin single crystal semiconductor layer) is used to form the bottom cell of the photoelectric conversion device according to this embodiment. By forming the photoelectric conversion device with such a structure, the amount of a semiconductor material used can be drastically reduced as compared to a bulk photoelectric conversion device. Further, a single crystal semiconductor substrate obtained by separating a thin single crystal semiconductor layer (a substrate to be reused) can be repeatedly reused. Accordingly, resources can be effectively utilized. Furthermore, operation of separating a thin single crystal semiconductor layer from a single crystal semiconductor substrate and separating another thin single crystal semiconductor layer from the rest of the single crystal semiconductor substrate is repeated, whereby a plurality of thin single crystal semiconductor layers can be obtained from one single crystal semiconductor substrate. This can lead to cost reduction. Thus, a resource-saving photoelectric conversion device which effectively utilizes a semiconductor material can be provided, and in addition, a manufacturing cost can be reduced.

In the photoelectric conversion device according to this embodiment, the top cell and the bottom cell can be obtained only by sequentially forming the second impurity semiconductor layer 114, the third impurity semiconductor layer 116, the non-single-crystal semiconductor layer 118, and the fourth impurity semiconductor layer 120 over the thin single crystal semiconductor layer. In addition, the first electrode 122 as a light-receiving surface electrode can be obtained only by film formation over the fourth impurity semiconductor layer 120. Therefore, even a tandem-type photoelectric conversion device in which unit cells are stacked can be manufactured through a simple process without complication of a manufacturing process. Thus, a photoelectric conversion device with excellent photoelectric conversion characteristics can be manufactured with high productivity.

To obtain the photoelectric conversion device according to this embodiment, a thin single crystal semiconductor layer with a thickness of greater than or equal to 1 µm and less than or equal to 10 µm, preferably greater than or equal to 3 µm and less than or equal to 5 µm is separated from a single crystal semiconductor substrate. Accordingly, the thin single crystal semiconductor layer does not need to be bonded to a base substrate or the like, and thus, a base substrate, an adhesive to be bonded to the base substrate, and the like are not needed. Therefore, a problem on reliability of a bonding portion can be solved. Accordingly, the restriction on a manufacturing process such as a process temperature is relaxed, and flexibility in a process is improved. Thus, productivity is improved. The second unit cell having a non-single-crystal semiconductor layer is formed to extend the wavelength range of light that is absorbed, whereby use efficiency of sunlight is increased. In addition, the reliability of a photoelectric conversion device itself can be increased.

Figure 5:
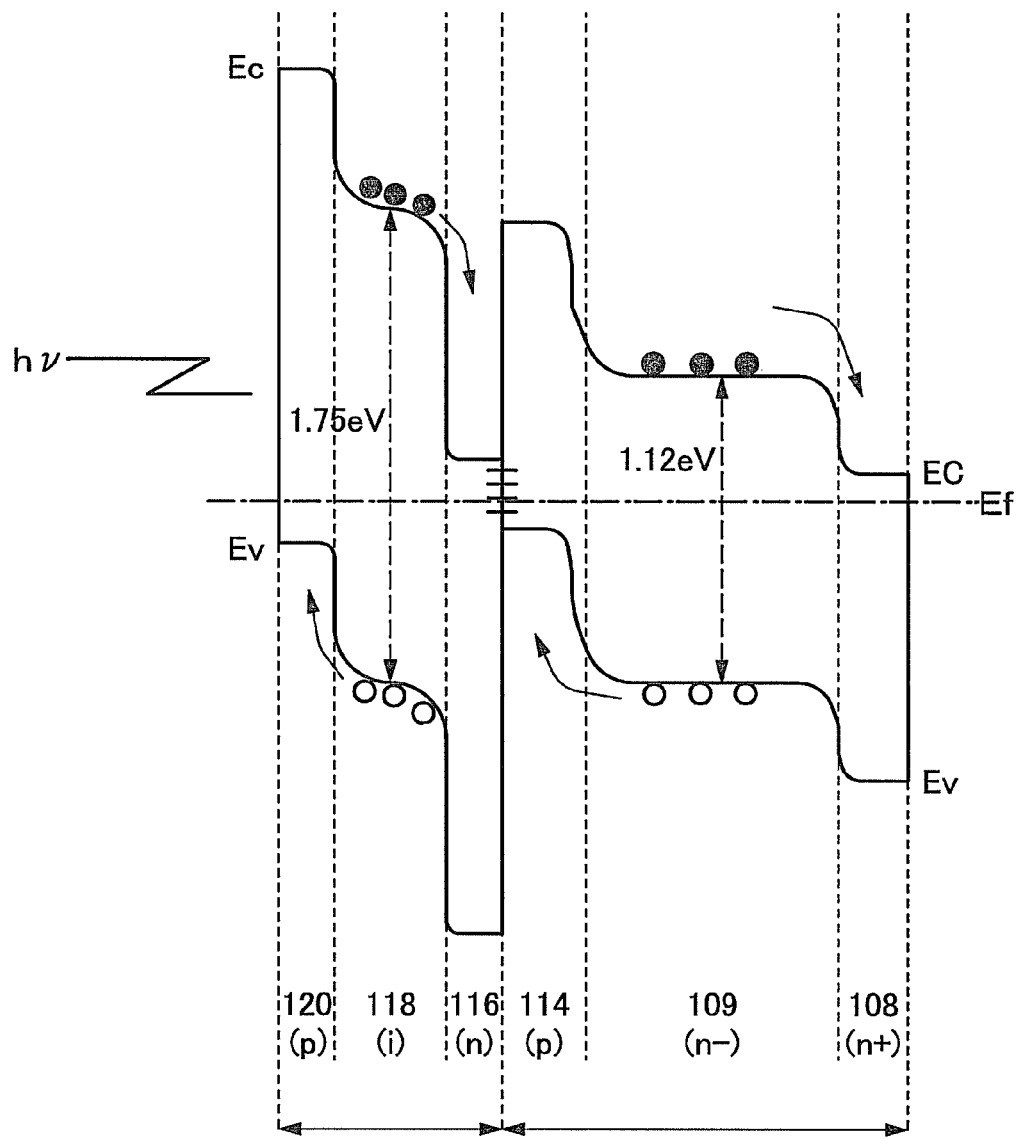
FIG. 5 is an energy band diagram illustrating operation of a photoelectric conversion device.

FIG. 5 shows an energy band diagram corresponding to the first unit cell 115 and the second unit cell 121 which perform photoelectric conversion in the present photoelectric conversion device. Here, an example is described in which the first unit cell 115 including the non-diffusion single crystal semiconductor layer 109 having an energy gap of 1.12 eV and the second unit cell 121 including the non-single-crystal semiconductor layer 118 having an energy gap of 1.75 eV are used. In the diagram, Ec indicates the level of the lower limit of a conduction band, Ev indicates the level of the upper limit of a valence band, and Ef indicates Fermi level.

From the right side of FIG. 5, the first impurity semiconductor layer 108, the non-diffusion single crystal semiconductor layer 109, and the second impurity semiconductor layer 114 which are included in the first unit cell 115, and the third impurity semiconductor layer 116, the non-single-crystal semiconductor layer 118, and the fourth impurity semiconductor layer 120 which are included in the second unit cell 121, are disposed. Light (hv) enters from the fourth impurity semiconductor layer 120 side. Therefore, the second unit cell 121 including the non-single-crystal semiconductor layer 118 with wide energy gap is provided on the light incidence side and the first unit cell 115 with narrow energy gap is provided behind the second unit cell 121. Note that FIG. 5 shows the case where the first impurity semiconductor layer 108 and the third impurity semiconductor layer 116 is formed using an n-type semiconductor and the second impurity semiconductor layer 114 and the fourth impurity semiconductor layer 120 are each formed using a p-type semiconductor. Further, FIG. 5 shows the case where the non-diffusion single crystal semiconductor layer 109 is formed using an n-type semiconductor.

As shown in FIG. 5, electrons excited by light absorption (which are denoted by black spots in FIG. 5) flow to the n-type semiconductor side and holes (which are denoted by white spots in FIG. 5) flow to the p-type semiconductor side. A p-n junction is formed at a connection portion of the first unit cell 115 and the second unit cell 121, which means that a diode is inserted in a direction opposite to a direction of current flow in view of an equivalent circuit. In this case, a recombination center is formed at the bonding interface between the second impurity semiconductor layer 114 and the third impurity semiconductor layer 116, and recombination current flows at this bonding interface. A microcrystalline semiconductor layer or an amorphous semiconductor layer is formed by a plasma CVD method or the like so that the second impurity semiconductor layer 114 and the third impurity semiconductor layer 116 are sequentially deposited. Thus, the p-n junction can be formed.

Note that this embodiment can be combined with any of other embodiments, as appropriate.

Embodiment 2

In this embodiment, an example of a method for manufacturing a photoelectric conversion device which is different from that described in the above embodiment will be described. Specifically, a method for forming a modified region in a single crystal semiconductor substrate as an embrittled layer by utilizing multiphoton absorption is described. Note that the same portions as in the above embodiment are denoted by the same reference numerals, and explanation thereof will be omitted or partially simplified.

In Embodiment 1, a mode is described with reference to FIG. 2A in which the embrittled layer 106 is formed in the single crystal semiconductor substrate 102 at a predetermined depth by irradiation with ions (typically hydrogen ions) accelerated by voltage and then the single crystal semiconductor substrate 102 is divided at the embrittled layer 106 by heat treatment to obtain the thin single crystal semiconductor layer 110, which is detached thin part of a single crystal semiconductor substrate. On the other hand, in this embodiment, a mode is described in which non-heat treatment using multiphoton absorption is performed on an inner portion of the substrate to form a modified region, which is equivalent to the embrittled layer 106 and serves as a trigger for the division.

Figure 6A:
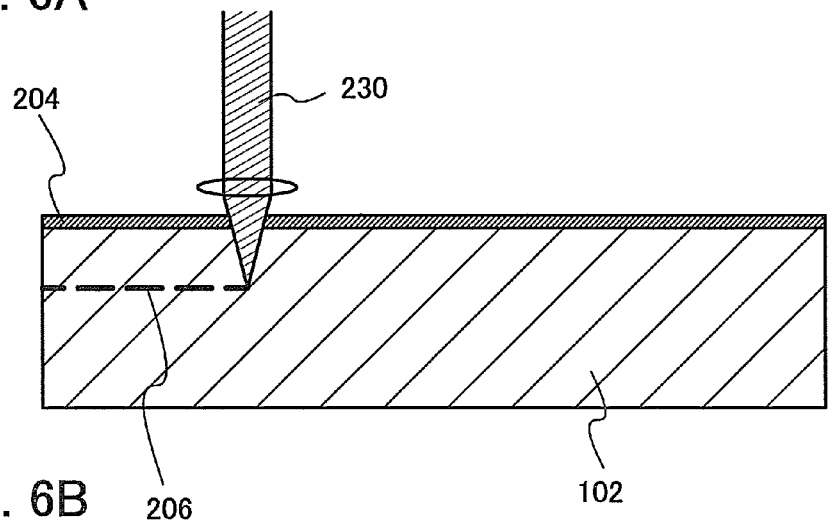
FIGS. 6A to 6C are cross-sectional views showing another method for manufacturing a photoelectric conversion device.

As shown in FIG. 6A, a laser beam 230 is concentrated into the single crystal semiconductor substrate 102 from the side on which the insulating layer 204 is formed, and the single crystal semiconductor substrate 102 is scanned by the laser beam 230. Thus, a modified region 206 is formed in the single crystal semiconductor substrate 102. The modified region 206 is formed by utilizing multiphoton absorption.

In general optical absorption, one photon is absorbed by a material and the energy level of the material becomes higher than that before optical absorption. In contrast, multiphoton absorption refers to a phenomenon in which a plurality of photons is concurrently absorbed by a material and the energy level of the material becomes higher than that before optical absorption.

Figure 7A:
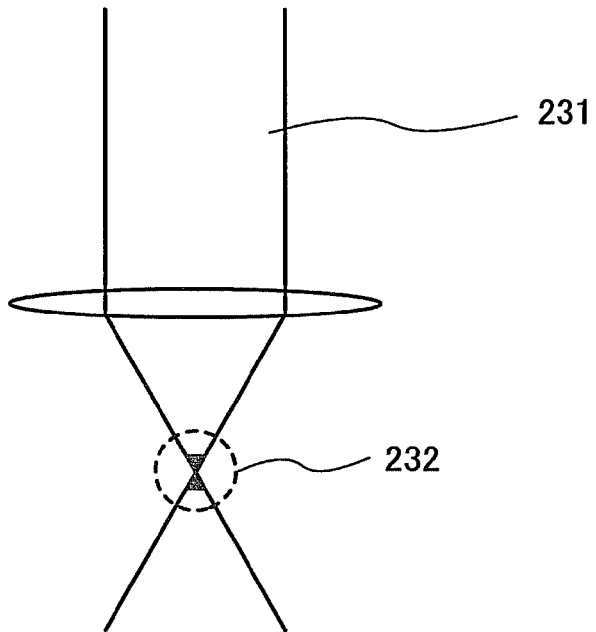
FIGS. 7A and 7B are schematic views showing reaction regions of multiphoton absorption and one-photon absorption.
Figure 7B:
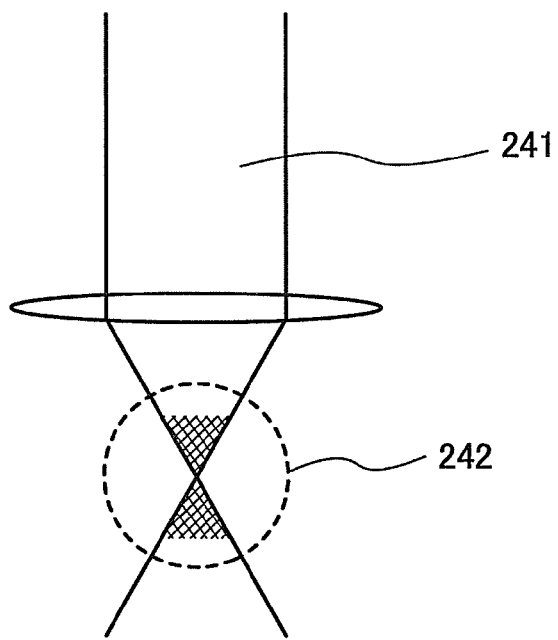

FIGS. 7A and 7B are schematic views of regions which make reaction by utilizing multiphoton absorption and one-photon absorption in the case where a laser beam is concentrated to make reaction such as modification by optical absorption. FIG. 7A shows an example of multiphoton absorption, and FIG. 7B shows an example of one-photon absorption. In FIG. 7A, a darker-shaded region in a region 232 of an optical path 231 which is surrounded by a dashed circle denotes a region which makes reaction. Similarly, in FIG. 7B, a darker-shaded region in a region 242 of an optical path 241 which is surrounded by a dashed circle denotes a region which makes reaction. In the case of one-photon absorption, reaction is made by a large region of the optical path 241 as shown in FIG. 7B. In contrast, in the case of multiphoton absorption, reaction is made in a localized region in the vicinity of the focus of the optical path 231 as shown in FIG. 7A. Therefore, utilization of multiphoton absorption makes it possible to treat an inner portion of an object to be treated, and for example, a modified region including voids of about several micrometers can be formed. In addition, in the case of multiphoton absorption, reaction is made to occur in a localized region in the vicinity of the focus. Accordingly, a modified region can be formed in a desired region without giving damage to other regions or with damage to other regions reduced. With the use of a laser beam which makes multiphoton absorption occur, modification reaction is made in a large area of the inner portion of an object to be treated, whereby separation at the modified region can be induced.

Further, in the case of multiphoton absorption, modification reaction occurs in the vicinity of the focus. Therefore, the position of the focus (the depth at which the laser beam is focused in an object to be treated) determines the depth at which the modified region 206 is formed. In other words, the depth at which the modified region 206 is formed in the single crystal semiconductor substrate 102 is determined by the position of the focus. The position of the focus can be easily controlled by a practitioner, and the focus can be positioned in a deep portion. By irradiation with a laser beam which utilizes multiphoton absorption, the depth at which the modified region is formed can be easily controlled.

The modified region 206 is another mode of the embrittled layer 106 of the above embodiment. That is, the modified region 206 refers to a region at which the single crystal semiconductor substrate 102 is divided into a thin single crystal semiconductor layer and a substrate to be reused (a single crystal semiconductor substrate) in a division step to be described later, and the vicinity of the region. As in the embrittled layer 106 in Embodiment 1, the depth at which the modified region 206 is formed determines the thickness of a thin single crystal semiconductor layer which is to be divided later. Therefore, the depth at which the modified region 206 is formed is controlled so that a thin single crystal semiconductor layer with a desired thickness, that is, with a thickness of greater than or equal to 1 µm and less than or equal to 10 µm, preferably greater than or equal to 3 µm and less than or equal to 5 µm can be obtained. As described above, the depth at which the modified region 206 is formed (in this embodiment, the distance from the laser-beam-irradiated side of the single crystal semiconductor substrate 102 to the modified region 206 in a film thickness direction) can be controlled by the position of the focus of the laser beam 230. Accordingly, the position of the focus of the laser beam 230 is controlled in consideration of the thickness of the thin single crystal semiconductor layer to be separated.

With the laser beam 230 focused on a region of the single crystal semiconductor substrate 102 at a predetermined depth, preferably at a deep portion, the single crystal semiconductor substrate 102 is scanned by the laser beam 230. By such scanning, the modified region 206 is formed in a region of an inner portion of the single crystal semiconductor substrate 102 on which the laser beam is focused, or the vicinity of the region. The modified region 206 formed by utilizing multiphoton absorption is an embrittled region in which voids of about several micrometers are formed. The laser beam 230 is focused on a predetermined depth to scan an entire surface of the single crystal semiconductor substrate 102, whereby the modified region 206 can be formed in a region of the single crystal semiconductor substrate 102 at a predetermined depth. Further, by utilizing multiphoton absorption, damage to a region other than the modified region 206 and generation of crystal defects can be reduced.

As a laser beam which makes multiphoton absorption occur, a femtosecond laser is preferably used for irradiation. A femtosecond laser emits a laser beam having a small pulse width of several tens of femtoseconds to several hundreds of femtoseconds. In addition, peak power of a femtosecond laser is incomparably higher than a continuous wave laser (CW laser), a pulsed laser which emits a laser beam having a pulse width of picoseconds or nanoseconds, or the like. By concentrating femtosecond laser pulse light into a spot of about several tens of micrometers, the focus has an intensity of higher than 100 TW/cm$^2$ in which photons are concentrated in a very dense state. Accordingly, a variety of nonlinear interactions with an object to be treated can occur. As one of the nonlinear interactions which are made by a femtosecond laser, multiphoton absorption is given.

Further, as shown in FIG. 6A, it is preferable to form the insulating layer 204 over at least one surface of the single crystal semiconductor substrate 102. As the insulating layer 204, an oxide layer such as a silicon oxide layer or a silicon oxynitride layer is preferably formed. In addition, the thickness d (nm) of the insulating layer 204 preferably satisfies the following equation (1).

$$d = \lambda/4n_{oxide\ layer} \times (2m+1)\ (m\text{:integer number greater than or equal to 0}) \quad (1)$$

In the above equation, the wavelength of the laser beam 230 which makes multiphoton absorption occur and is delivered later is denoted by λ (nm), and the refractive index of the insulating layer 204 (oxide layer) at the wavelength λ (nm) is denoted by $n_{oxide\ layer}$, provided that the insulating layer 204 is formed of an oxide layer. With the thickness d (nm) of the insulating layer 204 which satisfies the above equation (1), an anti-reflection effect is obtained. As a result, the laser beam 230 can be prevented from being reflected by the single crystal semiconductor substrate 102 which is an object to be treated, and the modified region 206 can be effectively formed in the inner portion of the single crystal semiconductor substrate 102.

Figure 6B:
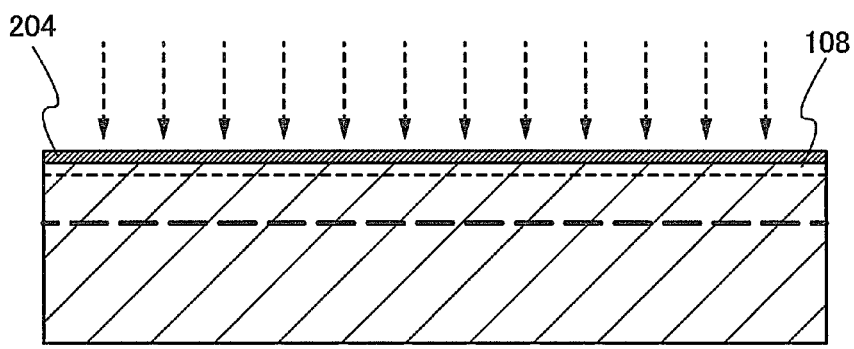

As shown in FIG. 6B, an impurity element imparting one conductivity type is introduced into the single crystal semiconductor substrate 102 to form the first impurity semiconductor layer 108 on the one surface side of the single crystal semiconductor substrate 102. The first impurity semiconductor layer 108 may be formed in a manner similar to Embodiment 1.

Figure 6C:
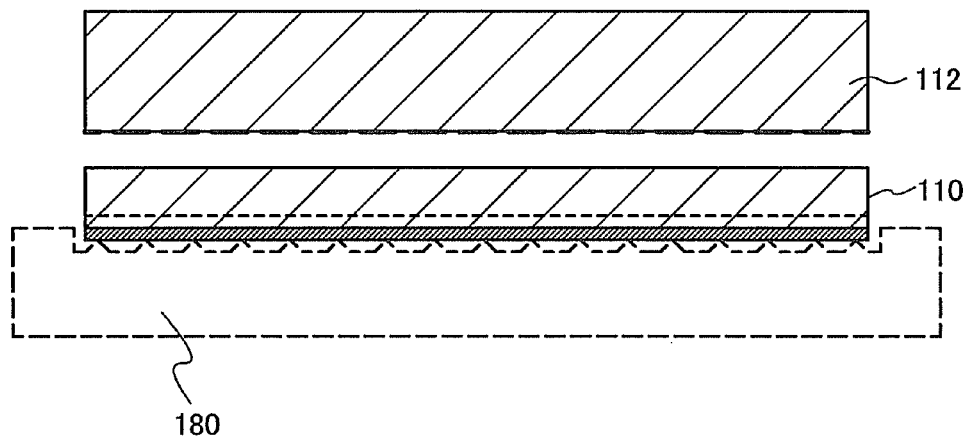

As shown in FIG. 6C, thin part of the single crystal semiconductor substrate 102 is detached. In specific, the single crystal semiconductor substrate 102 is divided at the modified region 206 or at the vicinity of the modified region 206, whereby the thin single crystal semiconductor layer 110 and the substrate to be reused 112 are obtained. The thin single crystal semiconductor layer 110 is detached thin part of a single crystal semiconductor substrate. Further, the substrate to be reused 112 is obtained by separation of the thin single crystal semiconductor layer 110 from the single crystal semiconductor substrate 102.

Thin part of the single crystal semiconductor substrate 102 can be detached by heat treatment. The heat treatment can be performed using a heating furnace, RTA, or the like. Further, as the heat treatment, dielectric heating using a high frequency wave such as microwave may be performed using a high-frequency generator. With distortion, stress, or the like due to the heat treatment, voids in the modified region 206 and the like allow division at the modified region 206.

Thin part of the single crystal semiconductor substrate 102 can alternatively be detached by application of external force. Specifically, external force is applied using a dynamical or mechanical method having a process based on the rule of dynamics, whereby the thin single crystal semiconductor layer 110 can be separated from the single crystal semiconductor substrate 102. For example, the thin single crystal semiconductor layer 110 can be separated from the single crystal semiconductor substrate 102 using a hand of a human or a tool. The modified region 206 is embrittled due to voids or the like formed by irradiation with the laser beam 230. Therefore, by application of physical force (external force) to the single crystal semiconductor substrate 102, an embrittled portion such as the voids in the modified region 206 allows the single crystal semiconductor substrate 102 to be divided. The division of the single crystal semiconductor substrate 102 by application of external force makes it possible to reduce time needed for the detachment, which can lead to improvement of productivity.

Further, the single crystal semiconductor substrate 102 can be divided by combining heat treatment and application of external force. Combination of heat treatment and application of external force makes it possible to further reduce time needed for the detachment.

Subsequently, a step shown in FIG. 3A and the subsequent steps are carried out, whereby a photoelectric conversion device can be manufactured.

Note that in this embodiment, the modified region 206 is formed by utilizing multiphoton absorption and scanning by the focus of the laser beam. By utilizing multiphoton absorption, damage to a region other than the modified region 206 and generation of crystal defects can be reduced. As a result, a heat treatment step shown in FIG. 3A of Embodiment 1 can be omitted, and/or heat treatment time and/or heat treatment temperature of the heat treatment step can be reduced. Accordingly, a process can be shortened, and thus, productivity can be improved.

With reference to FIG. 6A, an example is described in which the single crystal semiconductor substrate 102 is irradiated with the laser beam 230 from the side of the single crystal semiconductor substrate 102 which is separated to obtain the thin single crystal semiconductor layer 110 later. However, the single crystal semiconductor substrate 102 may be irradiated with the laser beam 230 from the opposite side, that is, from the side of the single crystal semiconductor substrate 102 which will serve as the substrate to be reused 112. In this embodiment, the position of the focus can be easily controlled. Therefore, such a structure can be employed in this embodiment.

Here, a specific example is described in which the modified region 206 is formed using a laser beam emitted from a femtosecond laser.

For example, a thermal oxide layer is formed as the insulating layer 204. The single crystal semiconductor substrate 102 is irradiated with the laser beam 230 from the insulating layer 204 side, and the laser beam 230 is concentrated into the inner portion of the single crystal semiconductor substrate 102, whereby the modified region 206 is formed in the single crystal semiconductor substrate 102 at a predetermined depth.

As a laser which emits the laser beam 230, a femtosecond laser is used. A titanium sapphire laser (Ti:sapphire laser) which emits a laser beam with a pulse width of 130 fs, a repetition rate of 1 kHz, and a wavelength λ of 800 nm is used as the femtosecond laser. In this case, the thickness d of the thermal oxide layer as the insulating layer 204 is approximately 133 nm since $n_{oxide\ layer}$ at a wavelength λ of 800 nm is approximately 1.5.

An impurity element imparting one conductivity type is introduced into the single crystal semiconductor substrate 102 to form the first impurity semiconductor layer 108. Then, heat treatment is performed to divide the single crystal semiconductor substrate 102. The heat treatment is performed at 200° C. for 2 hours and at 600° C. for two hours by using a heating furnace. Through the above-described steps, the thin single crystal semiconductor layer 110 can be separated from the single crystal semiconductor substrate 102.

As another example, a silicon oxide layer is formed as the insulating layer 204 by a plasma CVD method. As a laser which emits the laser beam 230, a fiber laser amplifying system is used which emits a laser beam having a pulse width of 400 fs, a repetition rate of 50 MHz, and a wavelength λ of 1560 nm and uses Er doped fiber amplifier (EDFA) as a gain fiber. In this case, the thickness d of the silicon oxide layer as the insulating layer 204 is approximately 260 nm since $n_{oxide\ layer}$ at a wavelength λ of 1500 nm is approximately 1.5.

An impurity element imparting one conductivity type is introduced into the single crystal semiconductor substrate 102 to form the first impurity semiconductor layer 108. Then, heat treatment is performed to separate the thin single crystal semiconductor layer 110 from the single crystal semiconductor substrate 102. As the heat treatment, heat treatment using a microwave of 2.45 GHz is performed for 10 minutes. Through the above-described steps, the thin single crystal semiconductor layer 110 can be separated from the single crystal semiconductor substrate 102.

Of course, a laser which emits a laser beam according to this embodiment is not limited to that described above, and any laser which makes multiphoton absorption occur may be used.

A laser beam which makes multiphoton absorption occur is used to form the modified region to be an embrittled layer, whereby the embrittled layer can be easily formed in a deep portion. Accordingly, thin part of the single crystal semiconductor substrate with a desired thickness can be easily detached, which can lead to improvement of photoelectric conversion efficiency of a photoelectric conversion device.

Note that this embodiment can be combined with any of other embodiments, as appropriate.

Embodiment 3

In this embodiment, an example of a structure of a photoelectric conversion device which is different from that in the above embodiments and a method for manufacturing the photoelectric conversion device having the structure will be described. Specifically, a structure is described in which a surface is provided with an anti-reflection structure (a structure of depressions and projections). Further, in this embodiment, an example is described in which a single crystalline silicon substrate is used as the single crystal semiconductor substrate 102. Note that the description of a portion which overlaps with the above embodiments is omitted or partially simplified.

Figure 8A:
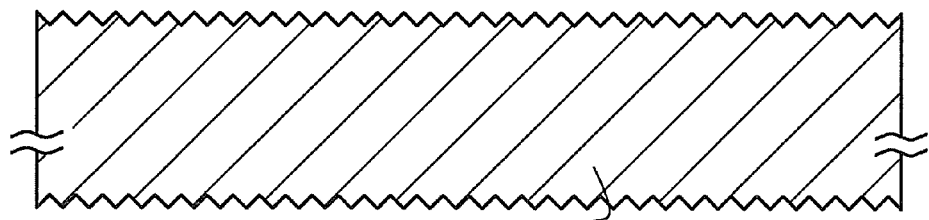
FIGS. 8A to 8C are cross-sectional views showing a method for manufacturing a photoelectric conversion device provided with an anti-reflection structure.

As shown in FIG. 8A, surfaces of a single crystal silicon substrate 1002 are etched utilizing the fact that silicon is etched using an alkaline solution at different etching rates according to the orientation of crystal planes. By the etching, minute depressions and projections are formed in the surfaces of the single crystal silicon substrate 1002. The depressions and projections are formed utilizing a phenomenon in which the rate of etching of silicon using an alkaline solution is the highest at the (100) plane and the rate is the lowest at the (111) plane. That is, by etching of a single crystal silicon substrate having the (100) plane using an alkaline solution, the (111) plane at which the etching rate is low appears in the surfaces. Finally, pyramid-like projections including the (111) planes and planes equivalent to the (111) planes appear.

As the alkaline solution, hydrazine, sodium hydroxide (NaOH), or potassium hydroxide (KOH) is used. For example, in the case of using hydrazine, a hydrazine aqueous solution of approximately 60 wt % is used. The hydrazine aqueous solution is heated at 100° C. to 115° C. to etch a single crystal silicon substrate, whereby a textured surface having pyramidal projections, that is, a texture structure can be obtained. Alternatively, as the alkaline solution, an aqueous solution in which the concentration of sodium hydroxide is 2 wt % to 5 wt % (isopropyl alcohol may be further mixed thereinto) is heated at 80° C. to 100° C. to etch a single crystal silicon substrate, whereby a surface similar to the above-described surface can be obtained.

Figure 11:
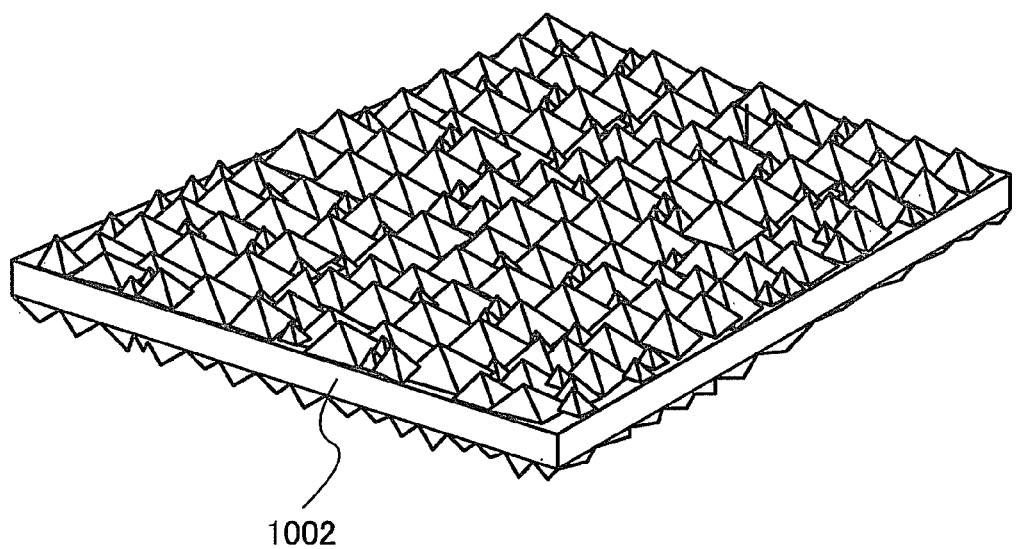
FIG. 11 is a perspective view showing a single crystal silicon substrate whose surface is provided with depressions and projections.

For example, by etching of the single crystal silicon substrate 1002 using an alkaline solution, pyramidal projections each having a size of 0.1 μm to 5 μm appear in the surface as shown in FIG. 11.

Figure 8B:
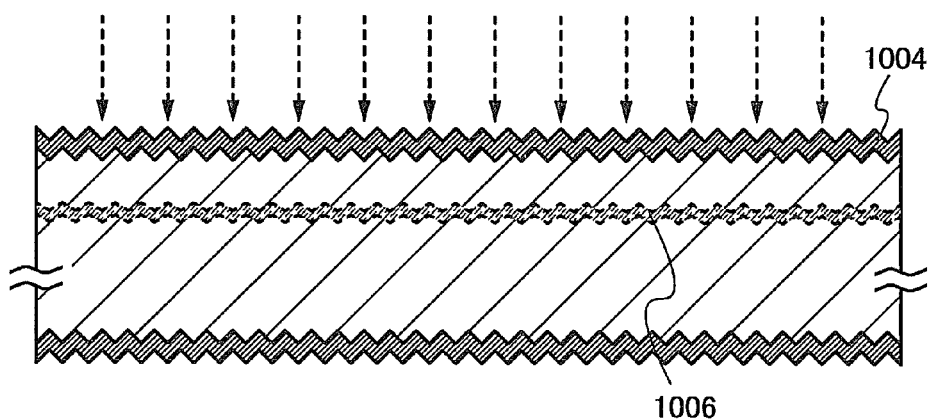

As shown in FIG. 8B, an insulating layer 1004 which serves as a protective insulating layer (cap layer) is formed. For example, an oxide film is formed on a surface of the single crystal silicon substrate 1002 by HCl oxidation to be used for the insulating layer 1004. By the HCl oxidation, a gettering effect can be expected and contamination with a solution used in etching for forming a texture can be removed.

Ions, typically hydrogen ions are implanted through the surface of the single crystal silicon substrate 1002 with the texture structure, whereby an embrittled layer 1006 is formed in a region of the single crystal silicon substrate 1002 at a predetermined depth, preferably in a deep portion. The hydrogen ions are implanted into the single crystal silicon substrate 1002 under influence of the structure of depressions and projections (texture structure) of the surface. Therefore, the depressions and projections in the surface are reflected in the distribution of hydrogen in the single crystal silicon substrate 1002. That is, the embrittled layer 1006 is formed so that the depressions and projections of the surface of the single crystal silicon substrate 1002 are reflected.

Figure 8C:
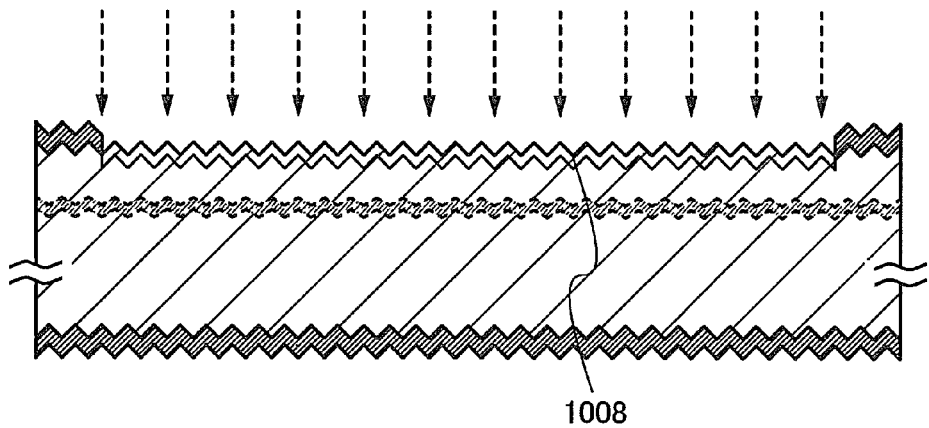

As shown in FIG. 8C, etching is performed so that the insulating layer 1004 formed over the textured surface of the single crystal silicon substrate 1002 is left in the peripheral edge portion of the single crystal silicon substrate 1002. Through the surface of the single crystal silicon substrate 1002 which is exposed by removal of the insulating layer 1004, an impurity element imparting one conductivity type is introduced to form an $n^+$ layer or a $p^+$ layer which is to be a first impurity semiconductor layer 1008. A thermal diffusion method may be used instead of an ion doping method.

Figure 9A:
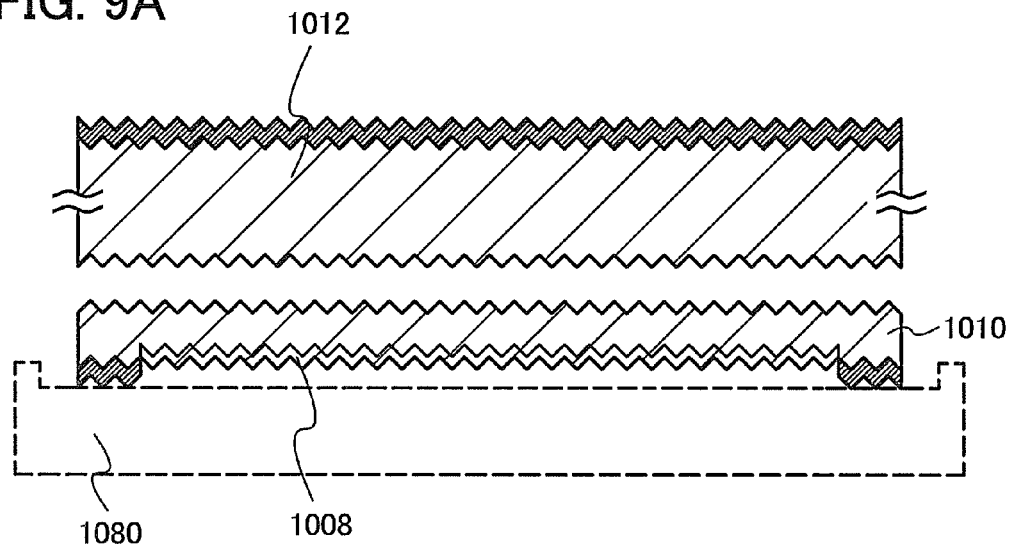
FIGS. 9A to 9C are cross-sectional views showing a method for manufacturing a photoelectric conversion device provided with an anti-reflection structure.

As shown in FIG. 9A, thin part of the single crystal silicon substrate 1002 is detached by heat treatment. In specific, the single crystal silicon substrate 1002 is divided at the embrittled layer 1006, whereby a thin single crystal silicon layer 1010, which is detached thin part of a single crystal silicon substrate, and a substrate to be reused 1012 are obtained. For the heat treatment, a heating furnace, RTA, dielectric heating using a high frequency wave such as microwave, irradiation with a laser beam, irradiation using a lamp, or the like is used as described above. Note that the side where the first impurity semiconductor layer 1008 is provided and the insulating layer 1004 is provided in the peripheral edge portion, is referred to as the thin single crystal silicon layer 1010. At the time of the division, a holding unit 1080 is preferably used to hold the thin single crystal silicon layer 1010. Further, the substrate to be reused 1012 can be repeatedly reused as a single crystal silicon substrate after being reprocessed. By implantation of hydrogen ions through the textured surface of the single crystal silicon substrate 1002, depressions and projections are also formed in a separation plane, and thus, an anti-reflection structure can be obtained.

Note that after the thin part of the single crystal silicon substrate 1002 is detached, heat treatment, specifically, the "second heat treatment" described in Embodiment 1 is preferably performed on the thin single crystal silicon layer 1010, which is the detached thin part of the single crystal silicon substrate.

Figure 9B:
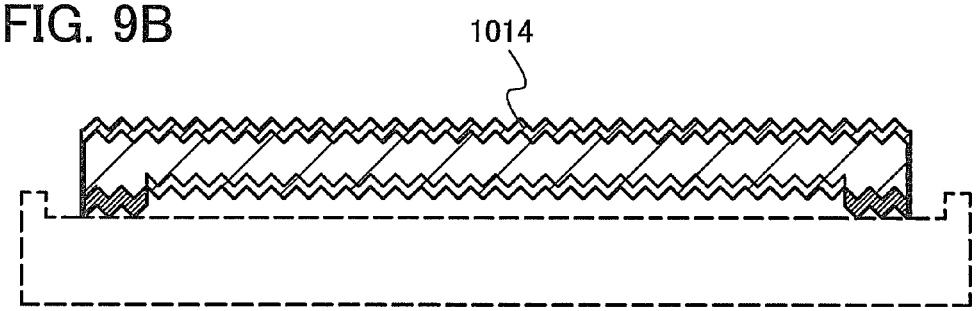

As shown in FIG. 9B, a second impurity semiconductor layer 1014 formed using a p-type semiconductor or an n-type semiconductor is formed over the thin single crystal silicon layer 1010. The second impurity semiconductor layer 1014 is formed using a microcrystalline semiconductor or an amorphous semiconductor, typically microcrystalline silicon or amorphous silicon. Further, the second impurity semiconductor layer 1014 has a conductivity type opposite to that of the first impurity semiconductor layer 1008. The second impurity semiconductor layer 1014 is formed over the thin single crystal silicon layer 1010 by a plasma CVD method.

Figure 9C:
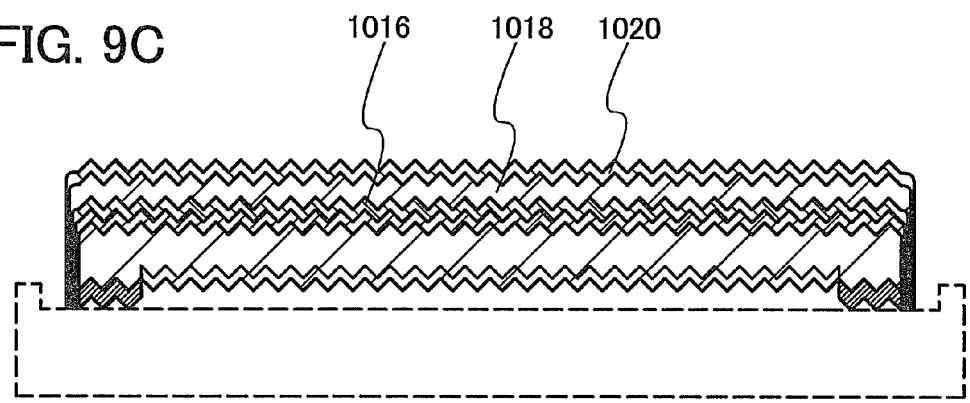

As shown in FIG. 9C, a third impurity semiconductor layer 1016 made of an n-type semiconductor, a non-single-crystal semiconductor layer 1018, and a fourth impurity semiconductor layer 1020 made of a p-type semiconductor are formed over the second impurity semiconductor layer 1014. Alternatively, a third impurity semiconductor layer 1016 formed using a p-type semiconductor, a non-single-crystal semiconductor layer 1018, and a fourth impurity semiconductor layer 1020 formed using an n-type semiconductor are formed. The third impurity semiconductor layer 1016 and the fourth impurity semiconductor layer 1020 are each formed using either a microcrystalline semiconductor or an amorphous semiconductor, typically microcrystalline silicon. Further, the third impurity semiconductor layer 1016 has a conductivity type opposite to that of the fourth impurity semiconductor layer 1020 and the second impurity semiconductor layer 1014. The non-single-crystal semiconductor layer 1018 is formed using a microcrystalline semiconductor or an amorphous semiconductor, typically amorphous silicon or microcrystalline silicon. The third impurity semiconductor layer 1016, the non-single-crystal semiconductor layer 1018, and the fourth impurity semiconductor layer 1020 are formed over the second impurity semiconductor layer 1014 by a plasma CVD method.

Figure 10A:
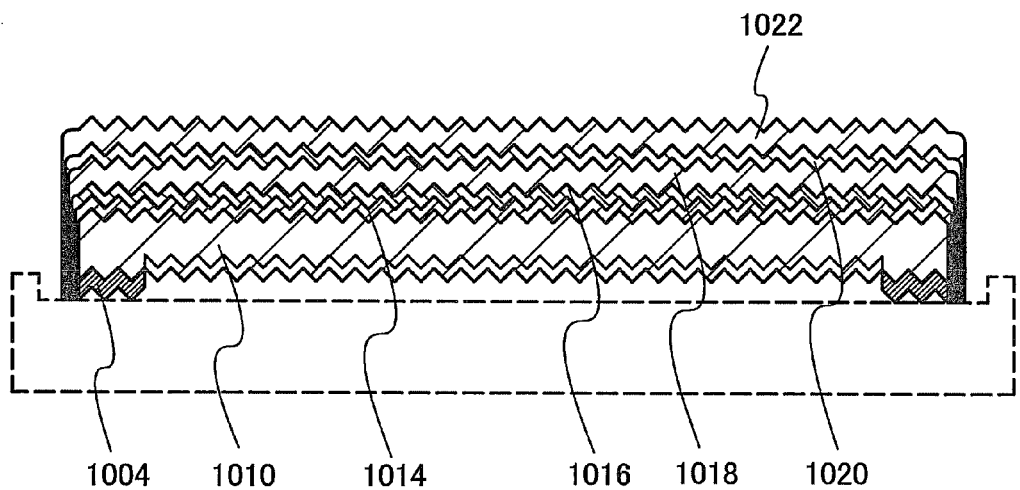
FIGS. 10A and 10B are cross-sectional views showing a method for manufacturing a photoelectric conversion device provided with an anti-reflection structure.

As shown in FIG. 10A, a first electrode 1022 is formed over the fourth impurity semiconductor layer 1020. As described above, the first electrode 1022 is formed using a transparent conductive material in order to make light pass therethrough. For example, the first electrode 1022 is formed over the fourth impurity semiconductor layer 1020 by a sputtering method.

Figure 10B:
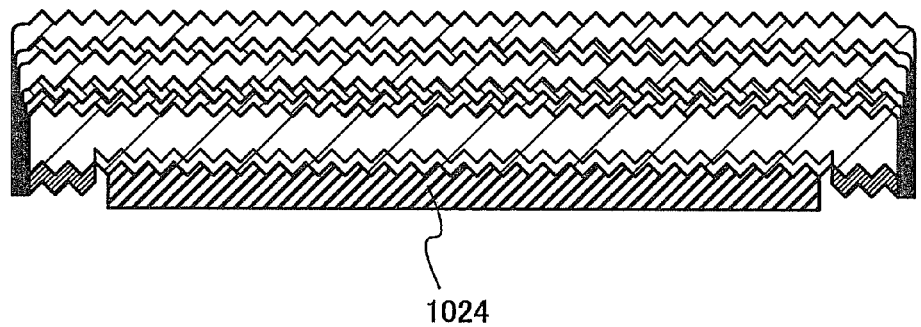

As shown in FIG. 10B, a second electrode 1024 is formed on the side opposite to the first electrode 1022 where the thin single crystal silicon layer 1010 is exposed. As described above, the second electrode 1024 is formed using a conductive material. Preferably, the second electrode 1024 is formed using a metal material in order to reflect light. For example, the second electrode 1024 is formed in contact with the surface where the thin single crystal silicon layer 1010 is exposed, by a sputtering method.

In this embodiment, a surface of the thin single crystal silicon layer 1010 to be an electrode formation surface on the back surface side is also textured. Therefore, at a surface of the second electrode 1024 as a back surface electrode which is in contact with the thin single crystal silicon layer 1010, light is reflected in a scattered manner in a semiconductor which forms the upper cell. Accordingly, light collection efficiency can be improved. Thus, the photoelectric conversion efficiency can be improved.

Note that this embodiment can be combined with any of other embodiments, as appropriate.

Embodiment 4

In this embodiment, an example of a structure of a photoelectric conversion device which is different from that in the above embodiments and a method for manufacturing the photoelectric conversion device having the structure will be described. Further, in this embodiment, an example is described in which a single crystalline silicon substrate is used as the above-described single crystal semiconductor substrate 102. Note that the description of a portion which overlaps with the above embodiments is omitted or partially simplified.

Figure 12A:
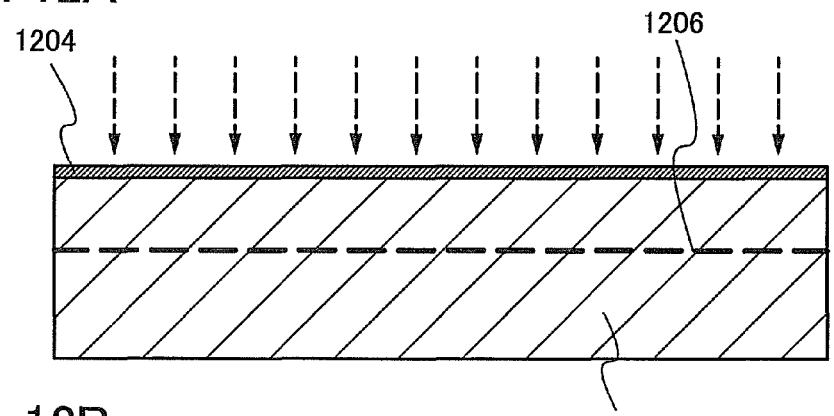
FIGS. 12A to 12C are cross-sectional views showing another method for manufacturing a photoelectric conversion device provided with an anti-reflection structure.

As shown in FIG. 12A, an insulating layer 1204 is formed over at least one surface of a single crystal silicon substrate 1202. In the case where the insulating layer 1204 is formed using a silicon nitride layer by a plasma CVD method, a surface of the single crystal silicon substrate 1202 is hydrogenated and the surface recombination velocity can thus be decreased. Also in the case where the insulating layer 1204 is formed by HCl oxidation, a dangling bond is hydrogenated since hydrogen is supplied to the interface between silicon and an oxidation film. Thus, the surface recombination velocity is decreased. Hydrogen ions are implanted through a surface of the single crystal silicon substrate 1202 where the insulating layer 1204 is formed, whereby an embrittled layer 1206 is formed in the single crystal silicon substrate 1202 at a predetermined depth, preferably at a deep portion.

Figure 12B:
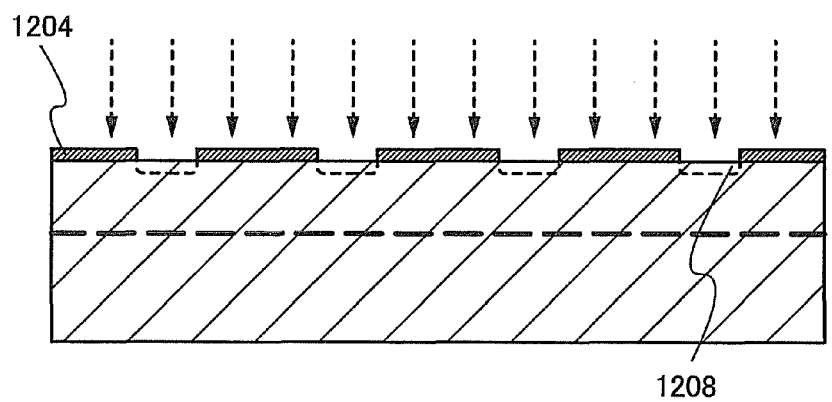
Figure 15A:
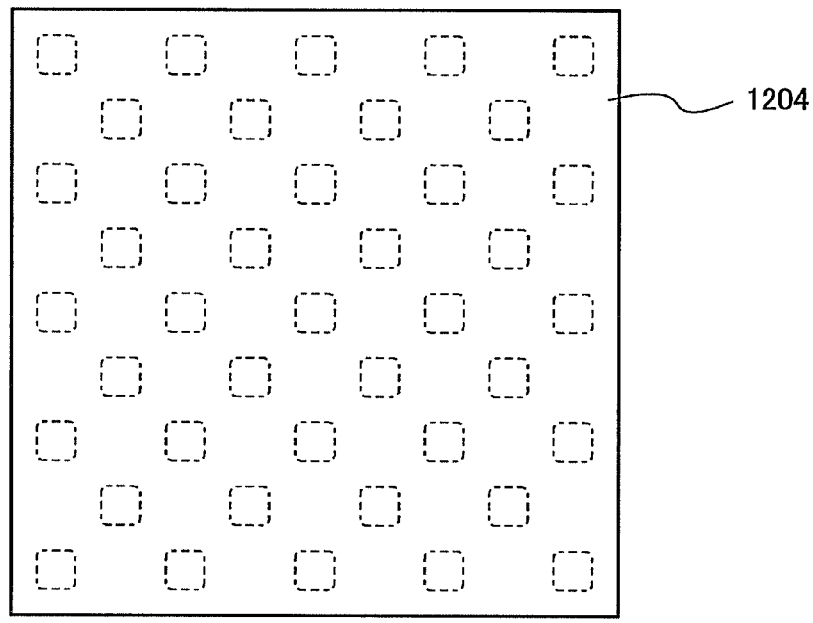
FIGS. 15A and 15B are a plan view illustrating a lattice pattern and a schematic view showing a single crystal silicon substrate whose surface is provided with depressions, respectively.

As shown in FIG. 12B, after forming openings in the insulating layer 1204, an impurity element imparting one conductivity type is introduced into the single crystal silicon substrate 1202 to form an $n^+$ region or a $p^+$ region to be a first impurity semiconductor region 1208. The openings in the insulating layer 1204 are spaced at predetermined intervals as shown in FIG. 15A. The insulating layer 1204 is used as a doping mask. The insulating layer 1204 is left in the peripheral edge portion of the single crystal silicon substrate 1202 so as to prevent addition of the impurity element imparting one conductivity type to the peripheral edge portion.

Figure 12C:
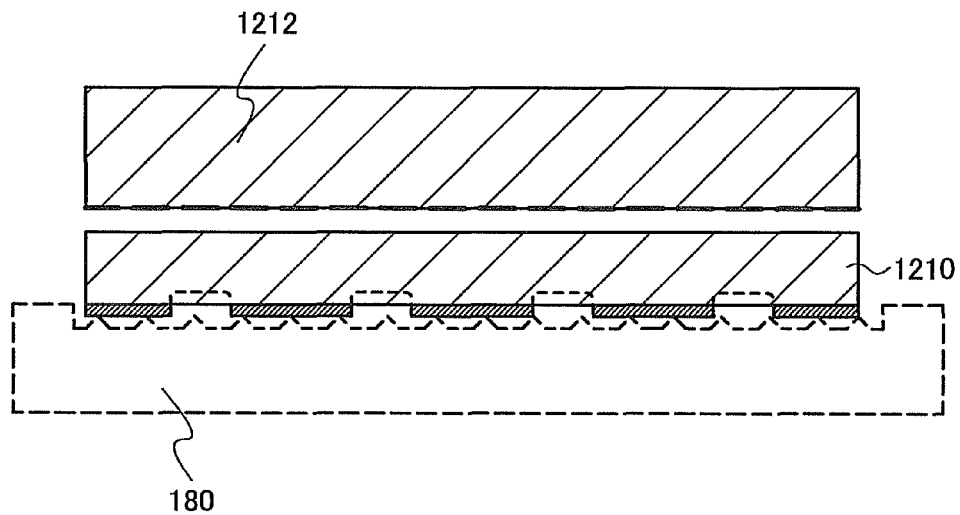

As shown in FIG. 12C, thin part of the single crystal silicon substrate 1202 is detached by heat treatment. In specific, the single crystal silicon substrate 1202 is divided into a thin single crystal silicon layer 1210 and a substrate to be reused 1212 at the embrittled layer 1206. For the heat treatment, a heating furnace, RTA, dielectric heating using a high frequency such as microwave, irradiation with a laser beam, irradiation using a lamp, or the like is used as described above.

Note that after the thin part of the single crystal silicon substrate 1202 is detached, heat treatment, specifically, the "second heat treatment" described in Embodiment 1 is preferably performed on the thin single crystal silicon layer 1210 which is the detached thin part of the single crystal silicon substrate.

Figure 13A:
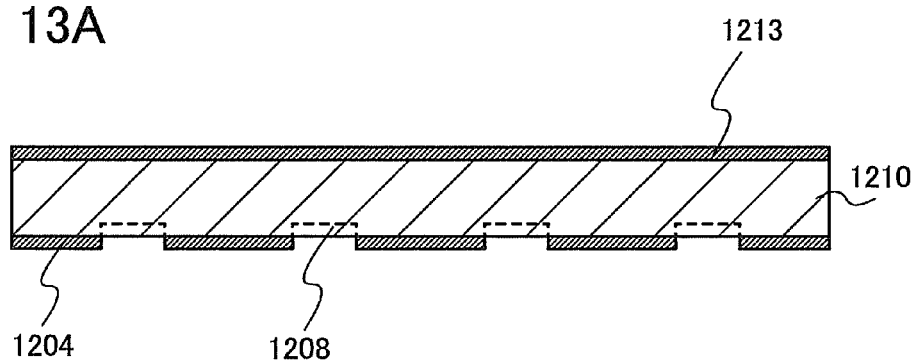
FIGS. 13A to 13D are cross-sectional views showing another method for manufacturing a photoelectric conversion device provided with an anti-reflection structure.

As shown in FIG. 13A, an insulating layer 1213 is formed over a division surface of the thin single crystal silicon layer 1210, which is the detached thin part of the single crystal silicon substrate. The insulating layer 1213 is formed using silicon oxide, silicon nitride, or the like. The thin single crystal silicon layer 1210 may be subjected to treatment for planarizing a surface by treatment using a laser or the like.

Figure 13B:
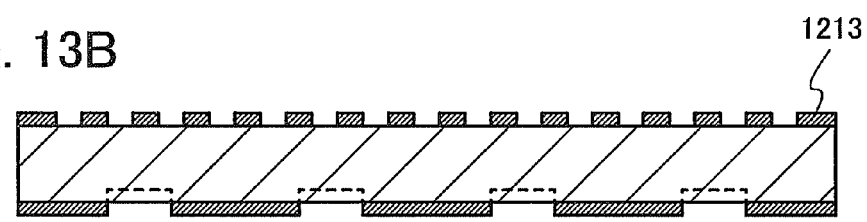

As shown in FIG. 13B, openings are formed in the insulating layer 1213 to expose a surface of the thin single crystal silicon layer 1210 in the openings. By providing the openings in the insulating layer 1213, a lattice pattern made of the insulating layer 1213 is formed over the surface of the thin single crystal silicon layer 1210.

Figure 13C:
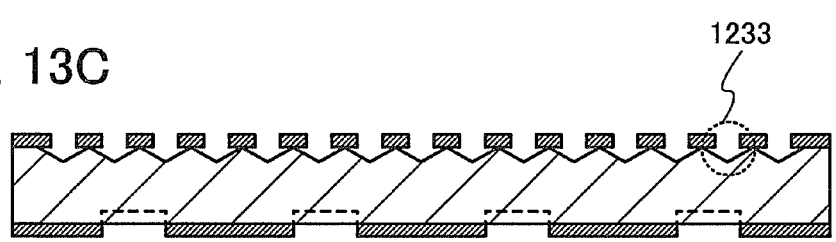
Figure 15B:
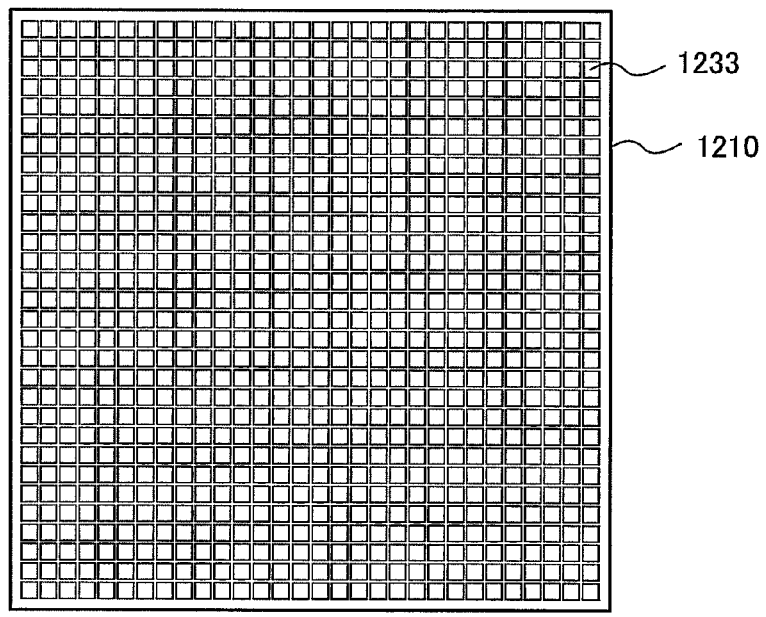

As shown in FIG. 13C, the surface of the thin single crystal silicon layer 1210 where the lattice pattern is formed is etched using an alkaline solution. In this case, when the thin single crystal silicon layer 1210 having the (100) plane (the single crystal silicon substrate 1202) is used as described above, anisotropic etching is performed due to variation in the etching rate between crystal planes, and the (111) plane at which the etching rate is low thus appears in the surface. Finally, an inverse-pyramid-like depression including the (111) plane and a plane equivalent to the (111) plane is formed in the thin single crystal silicon layer 1210 below the insulating layer 1213. Accordingly, a regular depression 1233 shown in FIG. 15B is formed in the surface of the thin single crystal silicon layer 1210.

Figure 13D:
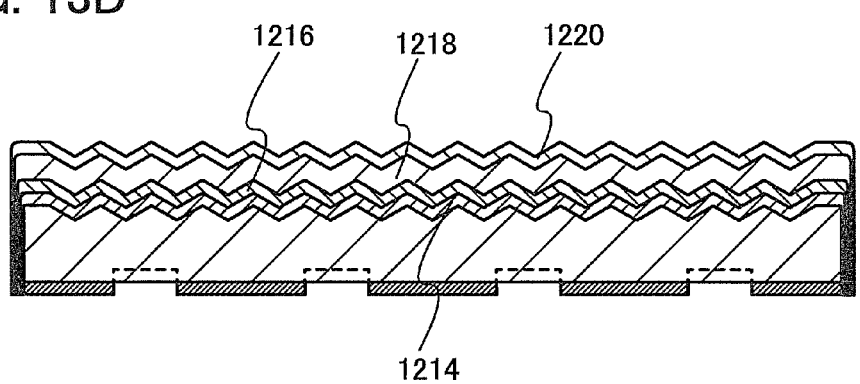

As shown in FIG. 13D, after removing the insulating layer 1213, a second impurity semiconductor layer 1214, a third impurity semiconductor layer 1216, a non-single-crystal semiconductor layer 1218, and a fourth impurity semiconductor layer 1220 are formed over the thin single crystal silicon layer 1210. As the second impurity semiconductor layer 1214, a p-type semiconductor or an n-type semiconductor having a conductivity type opposite to that of the first impurity semiconductor region 1208 is formed. As the third impurity semiconductor layer 1216, an n-type semiconductor or a p-type semiconductor having a conductivity type opposite to that of the second impurity semiconductor layer 1214 and the fourth impurity semiconductor layer 1220 is formed. As the fourth impurity semiconductor layer 1220, a p-type semiconductor or an n-type semiconductor having a conductivity type opposite to that of the third impurity semiconductor layer 1216 is formed. The second impurity semiconductor layer 1214, the third impurity semiconductor layer 1216, and the fourth impurity semiconductor layer 1220 are each formed using either a microcrystalline semiconductor or an amorphous semiconductor, typically microcrystalline silicon. The non-single-crystal semiconductor layer 1218 is formed using an amorphous semiconductor or a microcrystalline semiconductor, typically amorphous silicon or microcrystalline silicon. The second impurity semiconductor layer 1214, the third impurity semiconductor layer 1216, the non-single-crystal semiconductor layer 1218, and the fourth impurity semiconductor layer 1220 are formed by a plasma CVD method.

Figure 14A:
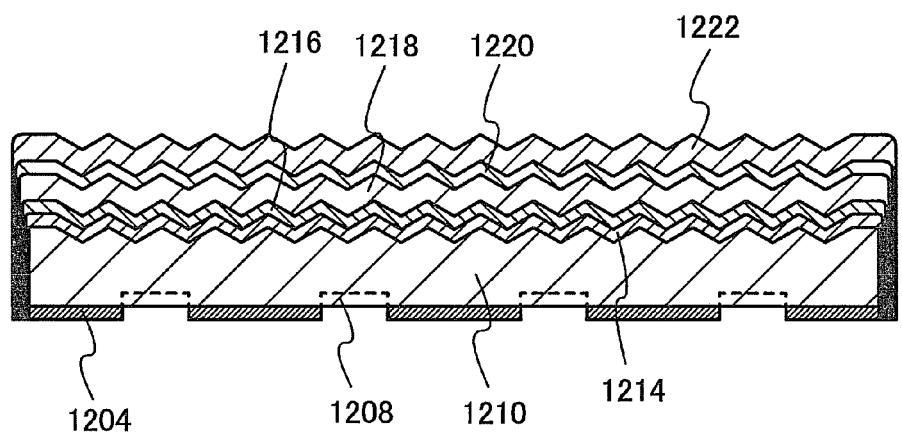
FIGS. 14A and 14B are cross-sectional views showing another method for manufacturing a photoelectric conversion device provided with an anti-reflection structure.

As shown in FIG. 14A, a first electrode 1222 is formed over the fourth impurity semiconductor layer 1220. As described above, the first electrode 1222 is formed using a transparent conductive material in order to make light to enter the first electrode 1222. For example, the first electrode 1222 is formed over the fourth impurity semiconductor layer 1220 by a sputtering method.

Figure 14B:
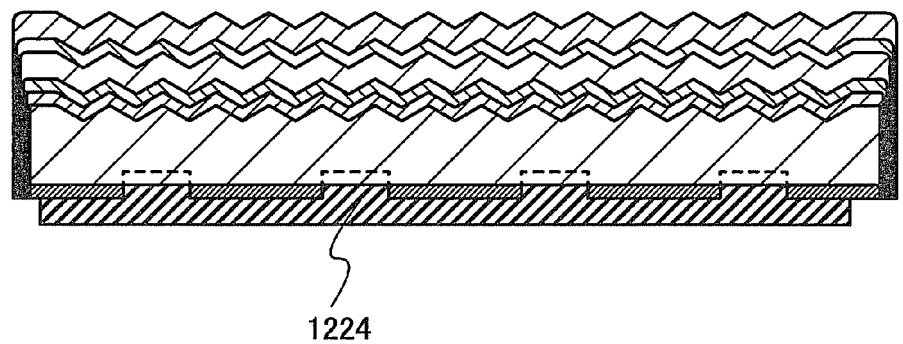

As shown in FIG. 14B, on the side opposite to the first electrode 1222, a second electrode 1224 is formed in contact with the insulating layer 1204 provided with openings, and the thin single crystal silicon layer 1210 exposed in the openings. Note that the second electrode 1224 is not formed in the peripheral edge portion of the thin single crystal silicon layer 1210 (the peripheral edge portion of the thin single crystal silicon layer 1210 on which the insulating layer 1204 is formed). As described above, the second electrode 1224 is formed using a conductive material. Preferably, the second electrode 1224 is formed using a metal material in order to reflect light. For example, the second electrode 1224 is formed in contact with the side where the thin single crystal silicon layer 1210 is exposed, by a sputtering method.

Note that the embrittled layer 1206 can alternatively be formed by utilizing multiphoton absorption as described above.

Note that this embodiment can be combined with any of the other embodiments, as appropriate.

Embodiment 5

In this embodiment, an example of a structure of a photoelectric conversion device which is different from that in the above embodiments and a method for manufacturing the photoelectric conversion device having the structure will be described. Specifically, a photoelectric conversion device including one unit cell having a single crystal semiconductor layer and a so-called stack-type photoelectric conversion device in which three unit cells are stacked are described.

Figure 16A:
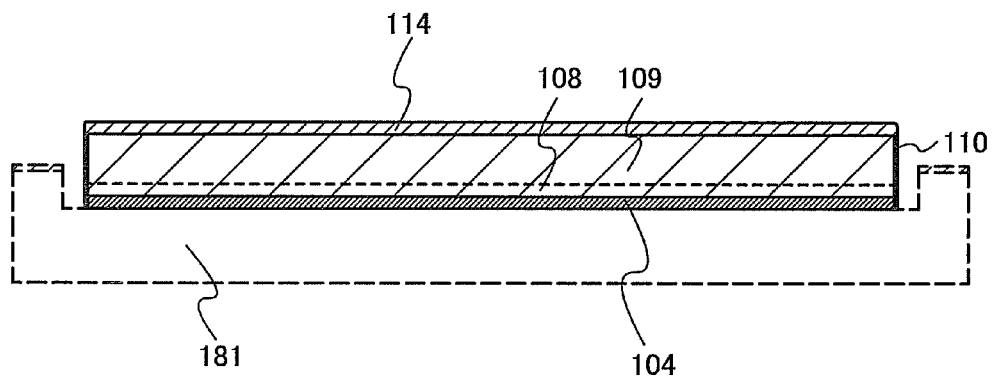
FIGS. 16A to 16C are cross-sectional views showing another method for manufacturing a photoelectric conversion device.

Through the steps of FIGS. 2A to 2C and FIGS. 3A and 3B, a state where the second impurity semiconductor layer 114 is formed over the thin single crystal semiconductor layer 110 is obtained as shown in FIG. 16A. The insulating layer 104 is formed in contact with the thin single crystal semiconductor layer 110, and the first impurity semiconductor layer 108 is formed on the side of the thin single crystal semiconductor layer 110 where the insulating layer 104 is formed.

Figure 16B:
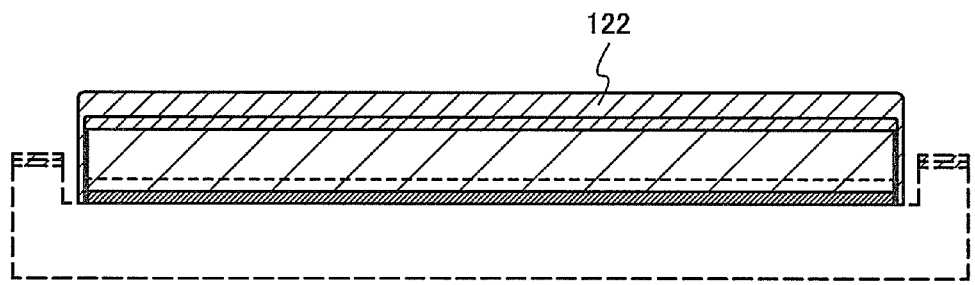

As shown in FIG. 16B, the first electrode 122 is formed over the second impurity semiconductor layer 114. As described above, the first electrode 122 is preferably formed using a transparent conductive material in order to make light enter from the first electrode 122 side. For example, the first electrode 122 is formed over the second impurity semiconductor layer 114 by a sputtering method.

Figure 16C:
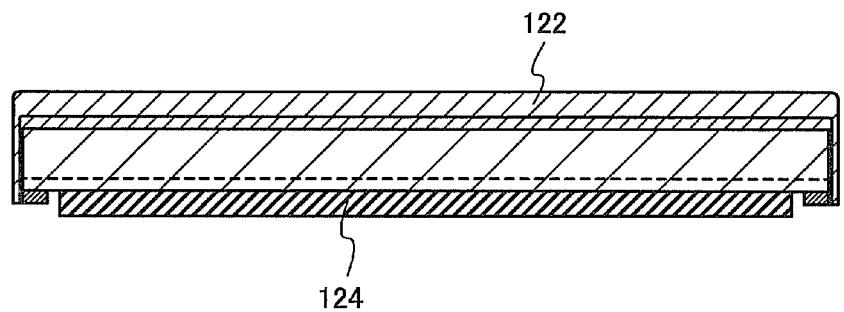

As shown in FIG. 16C, after the insulating layer 104 is selectively etched so that the insulating layer 104 is left in the peripheral edge portion of the thin single crystal semiconductor layer 110, a second electrode 124 is formed over the side on which the thin single crystal semiconductor layer 110 is exposed. The second electrode 124 is formed on the side opposite to the first electrode 122. Further, the second electrode 124 is not formed in the peripheral edge portion of the thin single crystal semiconductor layer 110 on which the insulating layer 104 is left.

Through the above-described steps, a photoelectric conversion device including one unit cell having a single crystal semiconductor layer is obtained.

Next, a stack-type photoelectric conversion device is described with reference to FIGS. 17A to 17C.

Through the steps of FIGS. 2A to 2C and FIGS. 3A and 3B, a state where the second impurity semiconductor layer 114 is formed over the thin single crystal semiconductor layer 110 is obtained. The insulating layer 104 is formed in contact with the thin single crystal semiconductor layer 110, and the first impurity semiconductor layer 108 is formed on the side of the thin single crystal semiconductor layer 110 on which the insulating layer 104 is formed.

Figure 17A:
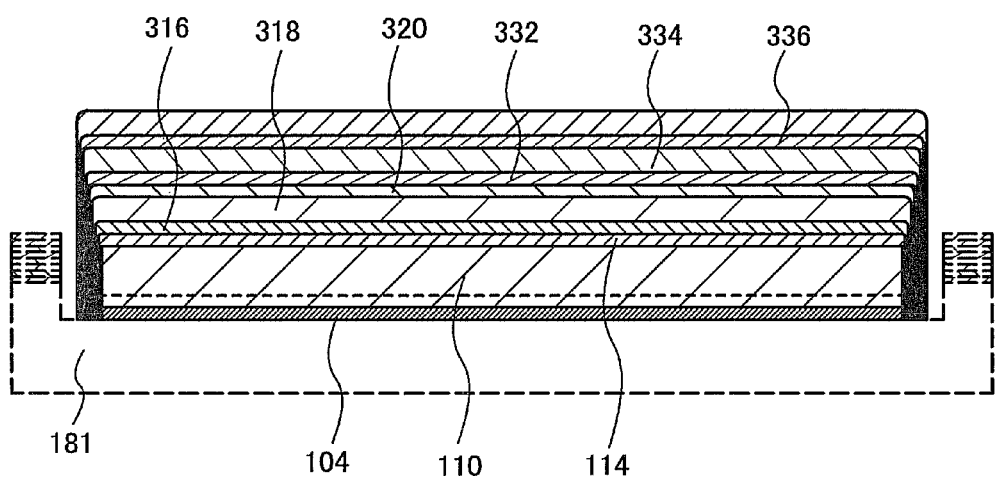
FIGS. 17A to 17C are cross-sectional views showing another method for manufacturing a stack-type photoelectric conversion device.

As shown in FIG. 17A, a third impurity semiconductor layer 316, a non-single-crystal semiconductor layer 318, a fourth impurity semiconductor layer 320, a fifth impurity semiconductor layer 332, a non-single-crystal semiconductor layer 334, and a sixth impurity semiconductor layer 336 are formed over the second impurity semiconductor layer 114. The third impurity semiconductor layer 316, the non-single-crystal semiconductor layer 318, and the fourth impurity semiconductor layer 320 form a second unit cell, and the fifth impurity semiconductor layer 332, the non-single-crystal semiconductor layer 334, and the sixth impurity semiconductor layer 336 form a third unit cell.

The non-single-crystal semiconductor layer 334 included in the third unit cell is formed using a semiconductor with an energy gap wider than the non-single-crystal semiconductor layer 318 included in the second unit cell. The non-single-crystal semiconductor layer 334 and the non-single-crystal semiconductor layer 318 are each formed using an amorphous semiconductor or a microcrystalline semiconductor, typically amorphous silicon, microcrystalline silicon, or amorphous silicon carbide. The third impurity semiconductor layer 316 and the fourth impurity semiconductor layer 320 have opposite conductivity types, and the fifth impurity semiconductor layer 332 and the sixth impurity semiconductor layer 336 have opposite conductivity types. The third impurity semiconductor layer 316 and the second impurity semiconductor layer 114 have opposite conductivity types, and the fourth impurity semiconductor layer 320 and the fifth impurity semiconductor layer 332 have opposite conductivity types. Further, the third impurity semiconductor layer 316, the fourth impurity semiconductor layer 320, the fifth impurity semiconductor layer 332, and the sixth impurity semiconductor layer 336 are each formed using a microcrystalline semiconductor or an amorphous semiconductor, typically microcrystalline silicon. For example, the second unit cell in which an n-type semiconductor, a non-single-crystal semiconductor, and a p-type semiconductor are stacked over the second impurity semiconductor layer 114 can be obtained, and the third unit cell in which an n-type semiconductor, a non-single-crystal semiconductor, and a p-type semiconductor are stacked over the second unit cell can be obtained.

Figure 17B:
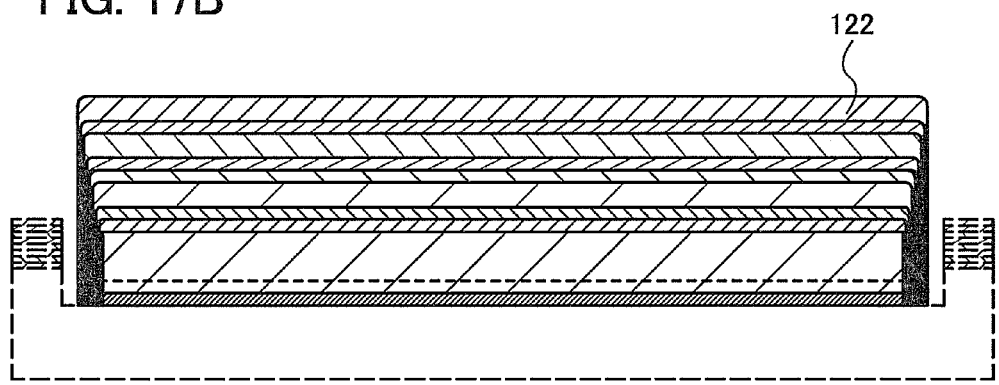

As shown in FIG. 17B, the first electrode 122 is formed over the sixth impurity semiconductor layer 336. As described above, the first electrode 122 is formed using a transparent conductive material in order to make light enter the first electrode 122 side by, for example, a sputtering method.

Figure 17C:
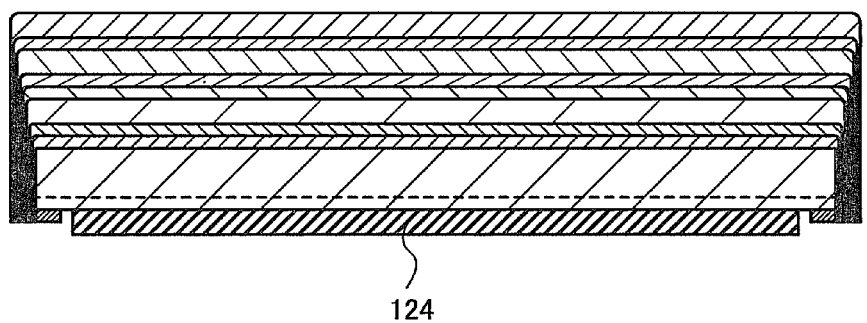

As shown in FIG. 17C, after the insulating layer 104 is selectively etched so that the insulating layer 104 is left in the peripheral edge portion of the thin single crystal semiconductor layer 110, the second electrode 124 is formed over the side on which the thin single crystal semiconductor layer 110 is exposed. The second electrode 124 is formed on the side opposite to the first electrode 122. Further, the second electrode 124 is selectively formed so that the second electrode 124 is not formed in the peripheral edge portion of the thin single crystal semiconductor layer 110 in which the insulating layer 104 is left.

Through the above-described steps, a photoelectric conversion device in which three unit cells are stacked is obtained. In the stack-type photoelectric conversion device shown in FIG. 17C, unit cells are arranged so that the energy gaps of the unit cells are in narrowing order from the light incidence side, that is, from the side on which the first electrode 122 is formed. With such a structure, light can be efficiently absorbed, and photoelectric conversion efficiency can be improved.

Of course, also in this embodiment, multiphoton absorption can be utilized at the time of detaching thin part of a single crystal semiconductor substrate.

Note that this embodiment can be combined with any of the other embodiments, as appropriate.

Embodiment 6

In this embodiment, a single crystal semiconductor substrate from which a thin single crystal semiconductor layer is separated is described.

A main point of the present invention is that a thin single crystal semiconductor layer is separated from a single crystal semiconductor substrate. The planar shape of a base single crystal semiconductor substrate is not particularly limited. In this embodiment, the shape of a substrate which can be used as a single crystal semiconductor substrate and an example of processing the substrate are described with reference to FIGS. 18A to 18D.

Figure 18A:
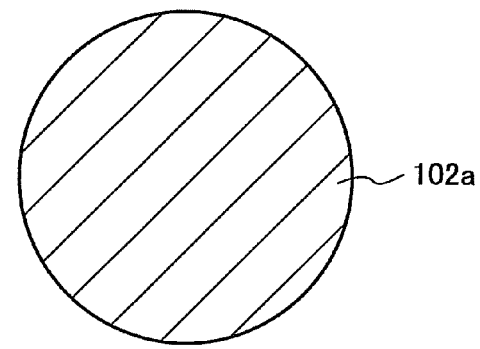
FIGS. 18A to 18D are diagrams illustrating examples of cutting out a single crystal semiconductor substrate with a predetermined shape.
Figure 18B:
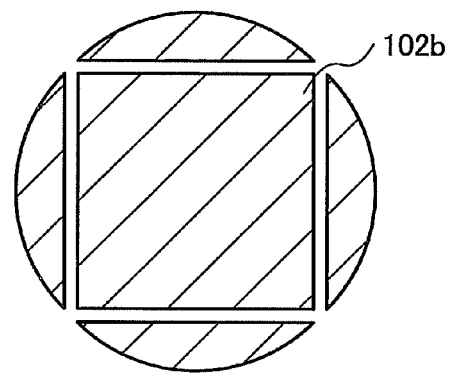
Figure 18C:
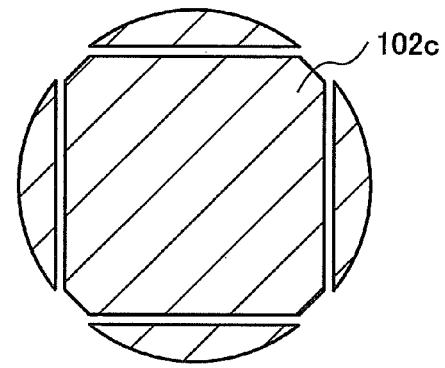

For example, a circular single crystal semiconductor substrate 102a may be used as shown in FIG. 18A, and alternatively, rectangular and substantially rectangular single crystal semiconductor substrates 102b and 102c may be cut out from circular substrates and used as shown in FIGS. 18B and 18C.

FIG. 18B illustrates an example in which the rectangular single crystal semiconductor substrate 102b is cut out to have a rectangular shape of maximum size with its corners being in contact with the periphery of the circular single crystal semiconductor substrate 102a. The angle at each corner of the single crystal semiconductor substrate 102b is about 90 degrees.

FIG. 18C illustrates an example in which the single crystal semiconductor substrate 102c is cut out so that the distance between opposing lines is longer than that of the rectangular region with the maximum size whose corners are in contact with the periphery of the circular single crystal semiconductor substrate 102a. The angle at each corner of the single crystal semiconductor substrate 102c is not 90 degrees, and the single crystal semiconductor substrate 102c has a polygonal shape, not a rectangular shape.

Figure 18D:
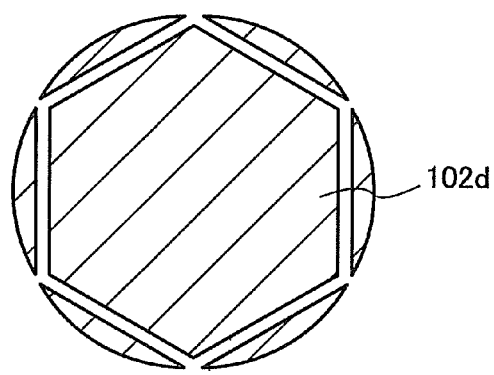

Further alternatively, as shown in FIG. 18D, a hexagonal single crystal semiconductor substrate 102d may be cut out. FIG. 18D illustrates an example in which the hexagonal single crystal semiconductor substrate 102d is cut out to have a hexagonal shape of maximum size with its corners being in contact with the periphery of the circular single crystal semiconductor substrate 102a. A hexagonal single crystal semiconductor substrate is cut out, whereby the waste corresponding to a cutting margin can be reduced more than the case of cutting out a rectangular single crystal semiconductor substrate.

Note that in this embodiment, an example is described in which a substrate with a desired shape is cut out from a circular single crystal semiconductor substrate. However, the present invention is not limited thereto, and a substrate with a desired shape may be cut out from a substrate with a shape other than a circular shape.

In manufacturing a photoelectric conversion device according to the present invention, the shape of a photoelectric conversion device can be selected by a practitioner by utilizing a single crystal semiconductor substrate processed into a desired shape. Further, a photoelectric conversion device with a shape appropriate for a purpose, such as a shape which is easily adapted to a manufacturing apparatus for manufacturing a photoelectric conversion device, a shape with which the photoelectric conversion device is easily placed in a desired position, or a shape with which the photoelectric conversion device is easily connected to another photoelectric conversion device in manufacturing a solar-electric power generation module, can be manufactured.

Note that this embodiment can be combined with any of other embodiments, as appropriate.

Embodiment 7

In this embodiment, an example is described in which the substrate to be reused 112 which is left after separation of the thin single crystal semiconductor layer 110 from the single crystal semiconductor substrate 102 is reprocessed.

As shown in FIG. 2C or FIG. 6C, the thin single crystal semiconductor layer 110 is separated from the single crystal semiconductor substrate 102 to obtain the substrate to be reused 112. The substrate to be reused 112 can be repeatedly reused as a single crystal semiconductor substrate by reprocessing treatment.

As the reprocessing treatment of the substrate to be reused 112, polishing treatment, etching treatment, thermal treatment, irradiation treatment using a laser, or the like can be used. As the polishing treatment, chemical mechanical polishing (CMP) treatment, mechanical polishing treatment, liquid jet polishing treatment, or the like is given. By the polishing treatment, a substrate excellent in surface planarity can be obtained.

In the peripheral edge portion of the substrate to be reused 112, a portion which cannot be separated as the thin single crystal semiconductor layer 110 remains as a projection depending on a case. The insulating layer 104 is left at the remaining projection. First, etching for removing the insulating layer 104 which remains in the substrate to be reused 112 is performed. For example, in the case where an insulating layer of silicon oxide, silicon oxynitride, a silicon nitride oxide, or the like remains, the insulating layer can be removed by wet etching using hydrofluoric acid. Further, a single crystal semiconductor portion remaining in the form of projections, and/or depressions and projections in a division surface of the substrate to be reused 112 can be removed by wet etching using a tetramethylammonium hydroxide (TMAH) solution.

After the substrate to be reused 112 is subjected to etching, a surface thereof is polished to be planarized. For the polishing treatment, mechanical polishing, CMP polishing, or the like can be employed. To smooth the surface of the substrate to be reused 112, the surface is preferably polished by approximately greater than or equal to 1 µm and less than or equal to 10 µm in thickness. After the polishing treatment, particles due to polishing or the like are left over the surface of the substrate to be reused 112. Therefore, it is preferable to perform cleaning with hydrofluoric acid, RCA cleaning, cleaning with ozone-containing water, or cleaning with a mixed solution of aqueous ammonia and hydrogen peroxide solution (this cleaning is also referred to as APM cleaning or SC1 cleaning) after the polishing treatment.

Note that the substrate to be reused 112 may be reprocessed only by polishing treatment.

Through the above-described steps, the substrate to be reused 112 can be reused as a single crystal semiconductor substrate. The single crystal semiconductor substrate which has been reprocessed may be repeatedly reused as a single crystal semiconductor substrate to be a material for manufacturing a photoelectric conversion device, or may also be used for other uses. For example, as described in the above embodiments, a photoelectric conversion device can be manufactured using a single crystal semiconductor substrate which is obtained by reprocessing a substrate to be reused. That is, a plurality of photoelectric conversion devices can be manufactured out of one single crystal semiconductor substrate. Accordingly, resource saving can be achieved, which can lead to cost reduction.

Note that this embodiment can be combined with any of other embodiments, as appropriate.

This application is based on Japanese Patent Application serial no. 2008-086313 filed with Japan Patent Office on Mar. 28, 2008, the entire contents of which are hereby incorporated by reference.

What is claimed is:

1. A method for manufacturing a photoelectric conversion device, comprising the steps of:
    forming an insulating layer over a first surface of a single crystal semiconductor substrate,
    introducing an ion to the single crystal semiconductor substrate through the insulating layer to form an embrittled layer in the single crystal semiconductor substrate,
    introducing a first impurity element into the single crystal semiconductor substrate through the insulating layer, thereby forming a first impurity semiconductor layer between the embrittled layer and the first surface of the single crystal semiconductor substrate,
    separating a single crystal semiconductor layer with the first impurity semiconductor layer from the single crystal semiconductor substrate at the embrittled layer,
    depositing a second impurity semiconductor layer on an embrittled plane side of the single crystal semiconductor layer,
    forming a first electrode adjacent to the second impurity semiconductor layer,
    selectively removing the insulating layer to retain a portion thereof in a peripheral edge portion of the first impurity semiconductor layer, and
    forming a second electrode in a region in which the insulating layer has been removed.

2. The method for manufacturing a photoelectric conversion device according to claim 1, wherein the single crystal semiconductor layer is separated to have a thickness of greater than or equal to 3 µm and less than or equal to 5 µm.

3. The method for manufacturing a photoelectric conversion device according to claim 1, wherein the embrittled layer is formed by an ion implantation method with mass separation in which irradiation with ions accelerated by voltage is performed from one surface side of the single crystal semiconductor substrate.

4. The method for manufacturing a photoelectric conversion device according to claim 1, wherein the embrittled layer is formed by scanning the single crystal semiconductor substrate by a laser beam which makes multiphoton absorption occur.

5. The method for manufacturing a photoelectric conversion device according to claim 1, wherein the second impurity semiconductor layer is formed by a plasma CVD method.

6. The method for manufacturing a photoelectric conversion device according to claim 1, wherein as the second impurity semiconductor layer, a microcrystalline semiconductor layer including an impurity element imparting n-type conductivity or a microcrystalline semiconductor layer including an impurity element imparting p-type conductivity is formed.

7. A method for manufacturing a photoelectric conversion device, comprising the steps of:
    forming an insulating layer over a first surface of a single crystal semiconductor substrate,
    introducing an ion into the single crystal semiconductor substrate through the insulating layer to form an embrittled layer in the single crystal semiconductor substrate,
    introducing a first impurity element into the single crystal semiconductor substrate through the insulating layer, thereby forming a first impurity semiconductor layer between the embrittled layer and the first surface of the single crystal semiconductor substrate,
    separating a single crystal semiconductor layer with the first impurity semiconductor layer from the single crystal semiconductor substrate at the embrittled layer,
    forming a second impurity semiconductor layer on an embrittled plane side of the single crystal semiconductor layer,
    forming a third impurity semiconductor layer adjacent to the second impurity semiconductor layer, wherein the second impurity semiconductor layer is located between the third impurity semiconductor layer and the single crystal semiconductor layer,
    forming a non-single-crystal semiconductor layer adjacent to the third impurity semiconductor layer,
    forming a fourth impurity semiconductor layer adjacent to the non-single-crystal semiconductor layer, forming a first electrode adjacent to the fourth impurity semiconductor layer, selectively removing the insulating layer to retain a portion thereof in a peripheral edge portion of the first impurity semiconductor layer, and forming a second electrode in a region in which the insulating layer has been removed.

8. The method for manufacturing a photoelectric conversion device according to claim 7, wherein the single crystal semiconductor layer is separated to have a thickness of greater than or equal to 3 µm and less than or equal to 5 µm.

9. The method for manufacturing a photoelectric conversion device according to claim 7, wherein the embrittled layer is formed by an ion implantation method with mass separation in which irradiation with ions accelerated by voltage is performed from one surface side of the single crystal semiconductor substrate.

10. The method for manufacturing a photoelectric conversion device according to claim 7, wherein the embrittled layer is formed by scanning the single crystal semiconductor substrate by a laser beam which makes multiphoton absorption occur.

11. The method for manufacturing a photoelectric conversion device according to claim 7, wherein the second impurity semiconductor layer, the third impurity semiconductor layer, the non-single-crystal semiconductor layer, and the fourth impurity semiconductor layer are formed by a plasma CVD method.

12. The method for manufacturing a photoelectric conversion device according to claim 7, wherein as the second impurity semiconductor layer, the third impurity semiconductor layer, and the fourth impurity semiconductor layer, a microcrystalline semiconductor layer including an impurity element imparting n-type conductivity or a microcrystalline semiconductor layer including an impurity element imparting p-type conductivity is formed, and as the non-single-crystal semiconductor layer, an amorphous semiconductor layer is formed.

* * * * *